(12) United States Patent
Choi et al.

(10) Patent No.: US 12,356,770 B2
(45) Date of Patent: Jul. 8, 2025

(54) DISPLAY DEVICE INCLUDING A PARTITION WALL AND A WAVELENGTH CONVERSION LAYER

(71) Applicant: Samsung Display Co., LTD., Yongin-si (KR)

(72) Inventors: Hae Yun Choi, Hwaseong-si (KR); Tae Hee Lee, Hwaseong-si (KR); Hyung Il Jeon, Seoul (KR); Joo Woan Cho, Seongnam-si (KR); Dae Ho Song, Hwaseong-si (KR); Byung Choon Yang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 529 days.

(21) Appl. No.: 17/733,153

(22) Filed: Apr. 29, 2022

(65) Prior Publication Data
US 2022/0352429 A1 Nov. 3, 2022

(30) Foreign Application Priority Data
Apr. 30, 2021 (KR) .................. 10-2021-0056163

(51) Int. Cl.
*H10H 20/85* (2025.01)
*H10H 20/851* (2025.01)
*H10H 20/855* (2025.01)

(52) U.S. Cl.
CPC ...... *H10H 20/8512* (2025.01); *H10H 20/855* (2025.01)

(58) Field of Classification Search
CPC ............................. H01L 33/502; H01L 33/58

USPC ......................................................... 257/79
See application file for complete search history.

(56) References Cited

U.S. PATENT DOCUMENTS

| 10,446,724 | B2 | 10/2019 | Kwon et al. |
| 10,770,441 | B2* | 9/2020 | Kuo .................. H01L 25/0753 |
| 10,833,229 | B2 | 11/2020 | Choi et al. |
| 10,861,906 | B2 | 12/2020 | Park et al. |
| 10,971,664 | B2 | 4/2021 | Kwon et al. |
| 11,424,225 | B2 | 8/2022 | Iguchi et al. |

(Continued)

FOREIGN PATENT DOCUMENTS

| CN | 110050511 A | * | 7/2019 | ............ H01L 33/58 |
| JP | 2003172927 A | * | 6/2003 | |
| JP | 2007324475 A | * | 12/2007 | ......... C09K 11/0883 |

(Continued)

*Primary Examiner* — Phuc T Dang
(74) *Attorney, Agent, or Firm* — Womble Bond Dickinson (US) LLP

(57) ABSTRACT

A display device includes a substrate; a partition wall on the substrate; a light-emitting element located in an emission area partitioned by the partition wall on the substrate and extended in a thickness direction of the substrate; a wavelength conversion layer over the light-emitting element in the emission area, and including a base resin and wavelength conversion particles dispersed in the base resin and configured to convert a wavelength of light emitted from the light-emitting element; and an optical member on the wavelength conversion layer and the partition wall and configured to adjust a path of light output from the wavelength conversion layer, and the optical member includes an optical layer and a first protruding pattern protruding from the optical layer toward the wavelength conversion layer.

21 Claims, 21 Drawing Sheets

(56) References Cited

U.S. PATENT DOCUMENTS 11,616,177 B2 3/2023 Kwon et al.
2020/0313056 A1* 10/2020 Hong ..................... H01L 33/62

FOREIGN PATENT DOCUMENTS

| JP | 20190076894 A | * | 7/2019 | ........... H01L 33/502 |
|----|---------------|---|--------|------------------------|
| JP | 2021-012251 A |   | 2/2021 |                        |
| KR | 10-2017-0026959 A |   | 3/2017 |                   |
| KR | 2018-0118488 A |   | 10/2018 |                      |
| KR | 10-1947643 B1 |   | 2/2019 |                        |
| KR | 2019-0118224 A |   | 10/2019 |                      |
| KR | 20190112674 A | * | 10/2019 | ............. H01L 33/58 |
| KR | 2019-0128010 A |   | 11/2019 |                      |
| WO | WO-2017159718 A1 | * | 9/2017 | ................ F21S 2/00 |

* cited by examiner

DISPLAY DEVICE INCLUDING A PARTITION WALL AND A WAVELENGTH CONVERSION LAYER

CROSS-REFERENCE TO RELATED APPLICATION

This application claims priority to and the benefit of Korean Patent Application No. 10-2021-0056163, filed on Apr. 30, 2021 in the Korean Intellectual Property Office, the entire disclosure of which is incorporated herein by reference.

BACKGROUND

1. Field

Aspects of embodiments of the present disclosure relate to a display device.

2. Description of the Related Art

As the information-oriented society evolves, various demands for display devices are ever-increasing. Display devices may be flat panel display devices, such as a liquid-crystal display device, a field emission display device, and a light-emitting display device. Light-emitting display devices may include an organic light-emitting display device including organic light-emitting diodes as the light-emitting elements; an inorganic light-emitting display device including inorganic semiconductor elements as the light-emitting elements, and a micro-LED display device including light-emitting diodes as the light-emitting elements.

Recently, a head mounted display including a light-emitting display device has been developed. A head mounted display (HMD) is a glasses-type monitor device providing virtual reality (VR) or augmented reality (AR) that is worn on a user's body in the form of glasses or a helmet to form a focus close to the user's eyes.

A high-resolution micro-LED display panel including micro light-emitting diodes is applied to head mounted displays. A micro light-emitting diode emits light of a single color. Therefore, a micro-LED display panel may include a wavelength conversion layer for converting the wavelength of light emitted from the micro light-emitting diode in order to represent different colors.

SUMMARY

According to an aspect of embodiments of the present disclosure, a display device having improved luminous efficiency is provided.

However, aspects and objects of the present disclosure are not limited to those mentioned herein, and other aspects and objects of the present disclosure will be apparent to those skilled in the art from the following descriptions.

According to one or more embodiments of the present disclosure, a display device includes: a substrate; a partition wall on the substrate; a light-emitting element located in an emission area partitioned by the partition wall on the substrate and extended in a thickness direction of the substrate; a wavelength conversion layer over the light-emitting element in the emission area, and comprising a base resin and wavelength conversion particles dispersed in the base resin and configured to convert a wavelength of light emitted from the light-emitting element; and an optical member on the wavelength conversion layer and the partition wall and configured to adjust a path of light output from the wavelength conversion layer, wherein the optical member comprises an optical layer and a first protruding pattern protruding from the optical layer toward the wavelength conversion layer.

According to one or more embodiments of the present disclosure, a display device includes: a substrate; a partition wall on the substrate; a light-emitting element located in an emission area partitioned by the partition wall on the substrate and extended in a thickness direction of the substrate; a wavelength conversion layer over the light-emitting element in the emission area, and comprising a base resin and wavelength conversion particles dispersed in the base resin and configured to convert a wavelength of light emitted from the light-emitting element; an optical member on the wavelength conversion layer and the partition wall and configured to adjust a path of light output from the wavelength conversion layer; and a color filter on the optical member in the emission area, wherein a refractive index of the optical member is greater than a refractive index of the color filter and a refractive index of the base resin.

Further details of one or more embodiments of the subject matter described in this specification are set forth in the accompanying drawings and the description below.

According to an aspect of embodiments of the present disclosure, light efficiency can be improved.

However, aspects and effects of the present disclosure are not limited to those described herein, and other aspects and effects of the present disclosure will be apparent to those skilled in the art from the following descriptions.

BRIEF DESCRIPTION OF THE DRAWINGS

The above and other aspects and features of the present disclosure will become more apparent by describing in detail some embodiments thereof with reference to the attached drawings, in which.

DETAILED DESCRIPTION

Figure 1:
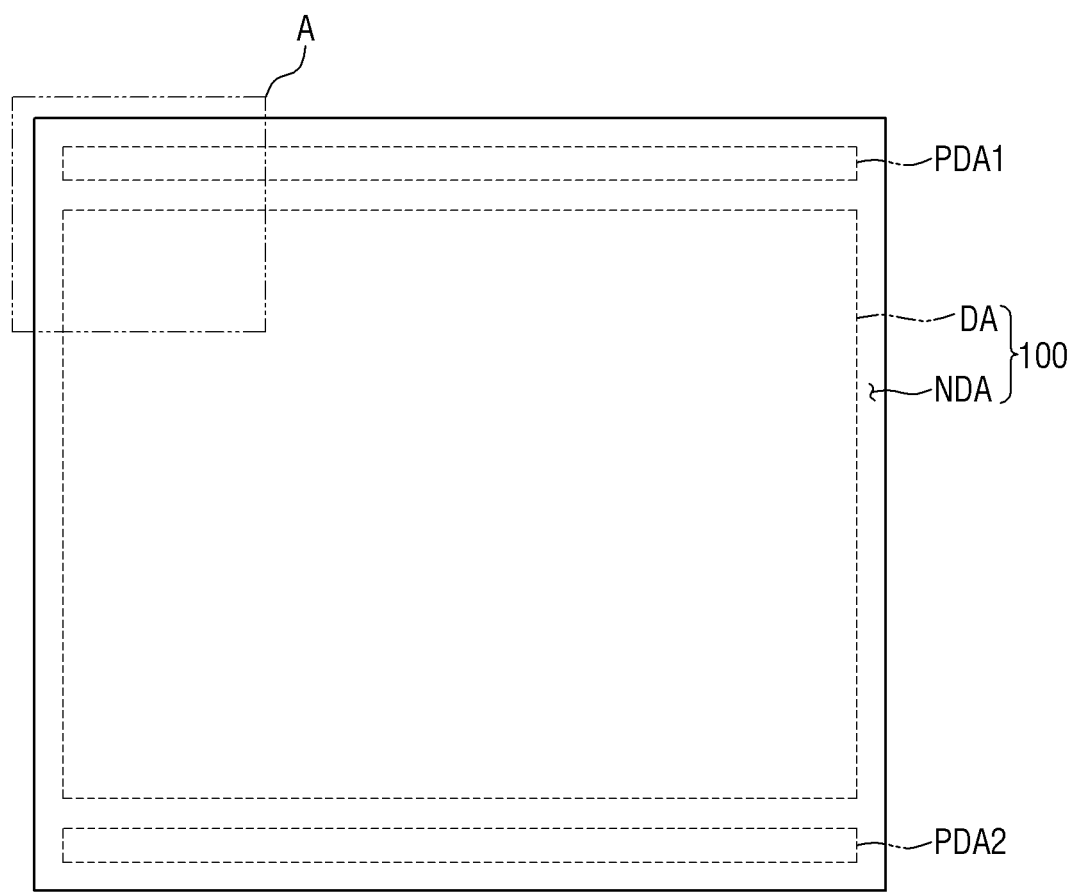
FIG. 1 is a view showing a layout of a display device according to an embodiment of the present disclosure.
Figure 1:
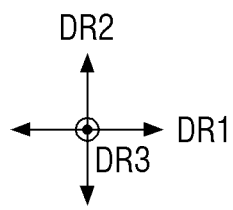

Specific structural and functional descriptions of some embodiments of the present invention disclosed herein are provided for illustrative purposes of the embodiments of the invention. However, the present invention may be embodied in many different forms without departing from the spirit and significant characteristics of the invention. Therefore, the embodiments of the present invention are disclosed for illustrative purposes and should not be construed as limiting the invention. That is, the present invention is defined by the scope of the claims.

It is to be understood that when an element is referred to as being related to another element such as being "coupled" or "connected" to another element, it may be directly coupled or connected to the other element, or one or more intervening elements may be present therebetween. In contrast, it is to be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same manner.

Throughout the specification, the same reference numerals will refer to the same or like parts.

It is to be understood that, although the terms "first," "second," "third," etc. may be used herein to describe various elements, components, regions, layers, and/or sections, these elements, components, regions, layers, and/or sections are not to be limited by these terms. These terms are used to distinguish one element, component, region, layer, or section from another element, component, region, layer, or section. Thus, "a first element," "first component," "first region," "first layer," or "first section" discussed below could be termed a second element, component, region, layer, or section without departing from the teachings herein.

The terminology used herein is for the purpose of describing particular embodiments and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, relative terms, such as "lower" or "bottom" and "upper" or "top," may be used herein to describe one element's relationship to another element as illustrated in the figures. It is to be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The term "lower," for example, can, therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath," for example, can, therefore, encompass both an orientation of above and below.

"About" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and the present disclosure, and are not to be interpreted in an idealized or overly formal sense unless expressly so defined herein.

Some embodiments are described herein with reference to cross-sectional illustrations that may be schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures may be schematic in nature and their shapes are not intended to illustrate the precise shape of a region and are not intended to limit the scope of the present claims.

Herein, some embodiments of the present invention will be described with reference to the attached drawings.

Figure 2:
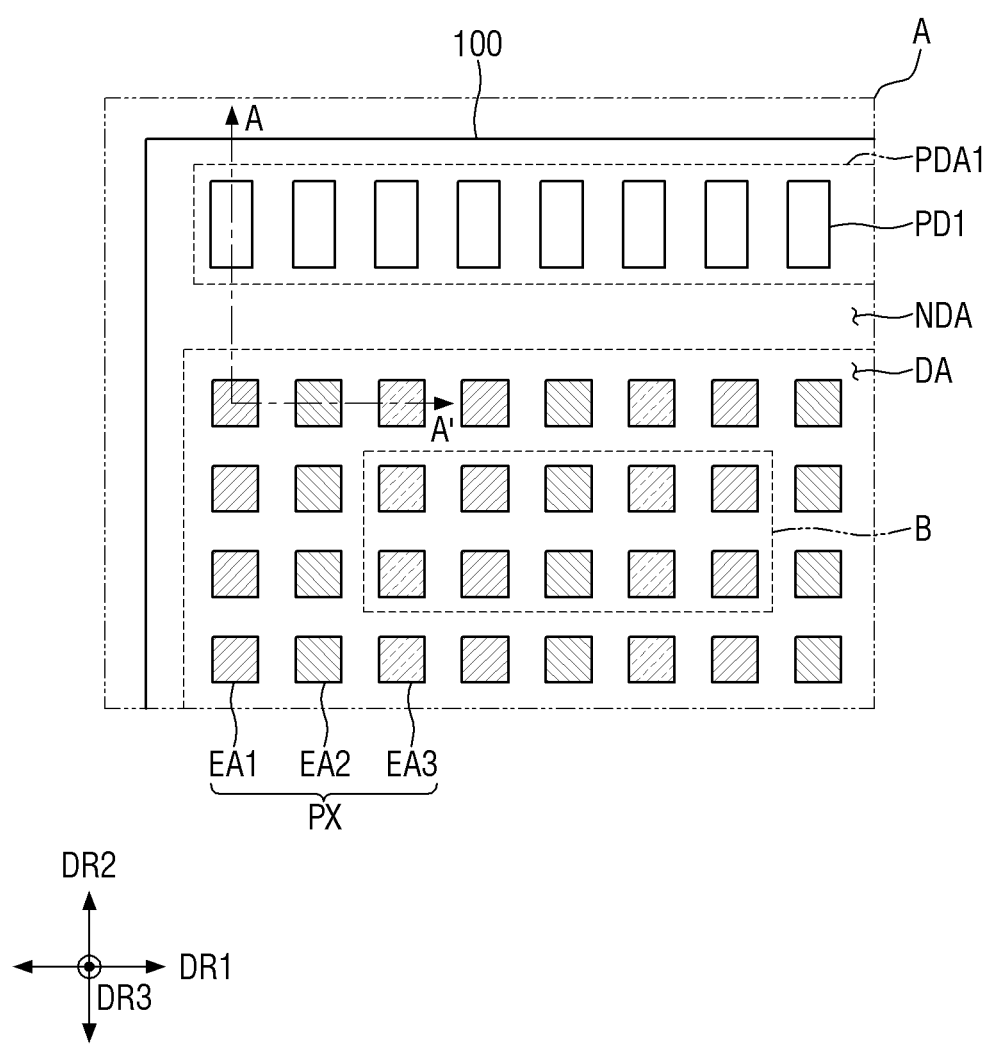
FIG. 2 is a view showing a layout of a region "A" of FIG. 1.

FIG. 1 is a view showing a layout of a display device according to an embodiment of the present disclosure; FIG. 2 is a view showing a layout of a region "A" of FIG. 1; and FIG. 3 is a view showing a layout of pixels of a display panel, corresponding to a region "B" shown in FIG. 2, according to an embodiment of the present disclosure.

Figure 3:
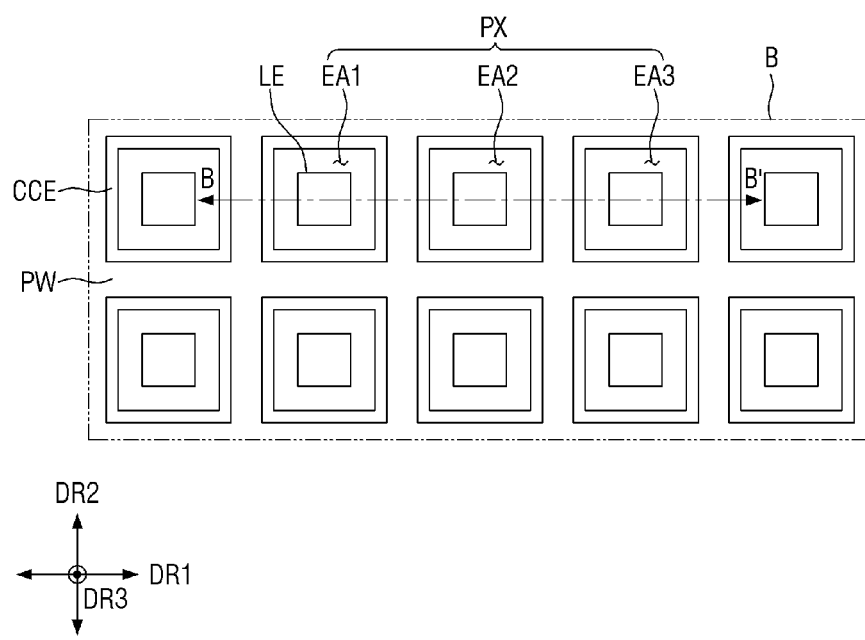
FIG. 3 is a view showing a layout of pixels of a display panel, corresponding to a region "B" shown in FIG. 2, according to an embodiment of the present disclosure.

In the example shown in FIGS. 1 to 3, the display device according to an embodiment is a micro light-emitting diode display device including a micro light-emitting diode as a light-emitting element. It is to be understood, however, that embodiments of the present disclosure are not limited thereto.

In addition, in the example shown in FIGS. 1 to 3, the display device according to an embodiment is implemented as a light-emitting diode on silicon (LEDoS) micro-display, i.e., light-emitting diodes are disposed on a semiconductor circuit board 110 formed via a semiconductor process. It is to be understood, however, that embodiments of the present disclosure are not limited thereto.

In FIGS. 1 to 3, a first direction DR1 indicates a horizontal direction of a display panel 100, a second direction DR2 indicates a vertical direction of the display panel 100, and a third direction DR3 refers to a thickness direction of the display panel 100 or the thickness direction of the semiconductor circuit board 110. As used herein, the terms "left," "right," "upper," and "lower" sides indicate relative positions when the display panel 100 is viewed from the top. For example, a right side refers to a side in the first direction DR1, a left side refers to the other side in the first direction DR1, an upper side refers to a side in the second direction DR2, and a lower side refers to the other side in the second direction DR2. In addition, an upper portion refers to a side indicated by the arrow of the third direction DR3, and a lower portion refers to the opposite side in the third direction DR3.

Referring to FIGS. 1 to 3, a display device according to an embodiment includes a display panel 100 including a display area DA and a non-display area NDA.

In an embodiment, the display panel 100 may have a rectangular shape having longer sides in the first direction DR1 and shorter sides in the second direction DR2 when viewed from the top. It is to be understood, however, that the shape of the display panel 100 when viewed from the top is not limited thereto. For example, the display panel 100 may have a polygonal, circular, oval, or irregular shape, other than the rectangular shape, when viewed from the top.

In the display area DA, images may be displayed. In the non-display area NDA, images may not be displayed. In an embodiment, the shape of the display area DA may follow the shape of the display panel 100 when viewed from the top. In the example shown in FIG. 1, the display area DA has a rectangular shape when viewed from the top. In an embodiment, the display area DA may be disposed at a central area of the display panel 100. The non-display area NDA may be disposed around the display area DA. In an embodiment, the non-display area NDA may surround the display area DA.

The display area DA of the display panel 100 may include a plurality of pixels PX. Each of the pixels PX may be defined as a minimum light-emitting unit for displaying white light.

Each of the pixels PX may include a plurality of emission areas EA1, EA2, and EA3 from each of which light exits. Although each of the plurality of pixels PX includes three emission areas EA1, EA2, and EA3 according to the example embodiment shown, the present disclosure is not limited thereto. For example, each of the plurality of pixels PX may include four emission areas.

Each of the plurality of emission areas EA1, EA2, and EA3 may include a light-emitting element LE that emits a first light. Although the light-emitting element LE has a square shape when viewed from the top in the example shown, embodiments of the present disclosure are not limited thereto. For example, the light-emitting element LE may have a polygonal, circular, oval, or irregular shape, other than a square shape.

Each of the first emission areas EA1 emits the first light. Each of the first emission areas EA1 may output the first light emitted from the light-emitting element LE as is. In an embodiment, the first light may be light in a blue wavelength range. The blue wavelength range may be approximately 370 nm to 460 nm, but embodiments of the present disclosure are not limited thereto.

Each of the second emission areas EA2 emits a second light. Each of the second emission areas EA2 may convert a part of the first light emitted from the light-emitting element LE into the second light to output the second light. In an embodiment, the second light may be light in a green wavelength range. The green wavelength range may be approximately 480 nm to 560 nm, but embodiments of the present disclosure are not limited thereto.

Each of the third emission areas EA3 emits a third light. Each of the third emission areas EA3 may convert a part of the first light emitted from the light-emitting element LE into the third light to output the third light. In an embodiment, the third light may be light in a red wavelength range. The red wavelength range may be approximately 600 nm to 750 nm, but embodiments of the present disclosure are not limited thereto.

The first emission areas EA1, the second emission areas EA2, and the third emission areas EA3 may be arranged sequentially and repeatedly in the first direction DR1. For example, the first emission areas EA1, the second emission areas EA2, and the third emission areas EA3 may be arranged in the order of the first emission area EA1, the second emission area EA2, and the third emission area EA3 in the first direction DR1.

The first emission areas EA1 may be arranged in the second direction DR2. The second emission areas EA2 may be arranged in the second direction DR2. The third emission areas EA3 may be arranged in the second direction DR2.

The plurality of emission areas EA1, EA2, and EA3 may be partitioned by a partition wall PW. In an embodiment, the partition wall PW may be disposed to surround the light-emitting elements LE. The partition wall PW may be spaced apart from the light-emitting elements LE. In an embodiment, the partition wall PW may have a mesh shape, a net shape, or a grid shape when viewed from the top.

Although each of the emission areas EA1, EA2, and EA3 defined by the partition wall PW has a square shape when viewed from the top in the example shown in FIGS. 2 and 3, the present disclosure is not limited thereto. For example, each of the plurality of emission areas EA1, EA2, and EA3 defined by the partition wall PW may have a polygonal, circular, oval, or irregular shape, other than a square shape.

A common connection electrode CCE may be disposed to overlap the partition wall PW in the third direction DR3. In an embodiment, the common connection electrode CCE may be disposed to surround the light-emitting elements LE. The common connection electrode CCE may be spaced apart from the light-emitting element LE. In an embodiment, the common connection electrode CCE may have a mesh shape, a net shape, or a grid shape when viewed from the top.

A width Wcce of the common connection electrode CCE in the first direction DR1 or the second direction DR2 may be larger than a width Wpw of the partition wall PW. In an embodiment, the partition wall PW may completely overlap the common connection electrode CCE in the third direction DR3. A part of the common connection electrode CCE may overlap the partition wall PW in the third direction DR3.

The non-display area NDA may include a first pad area PDA1 and a second pad area PDA2.

The first pad area PDA1 may be disposed in the non-display area NDA. The first pad area PDA1 may be located at the upper side of the display panel 100. The first pad area PDA1 may include first pads PD1 connected to an external circuit board CB (see FIG. 4).

The second pad area PDA2 may be disposed in the non-display area NDA. The second pad area PDA2 may be located at the lower side of the display panel 100. The second pad area PDA2 may include second pads connected to an external circuit board CB (see FIG. 4). In an embodiment, the second pad area PDA2 may be omitted.

Figure 4:
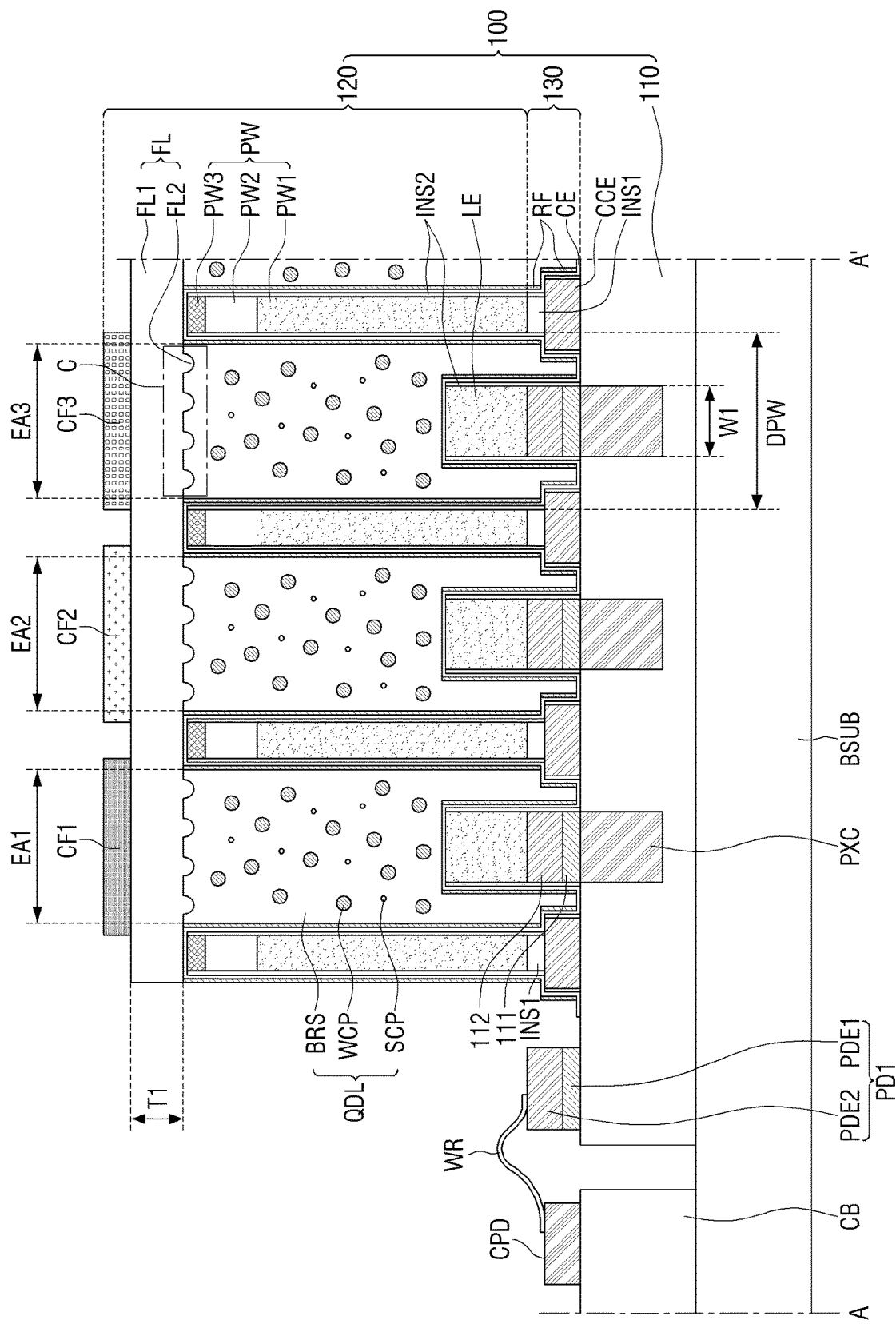
FIG. 4 is a cross-sectional view showing an example of the display panel taken along the line A-A' of FIG. 2.
Figure 5:
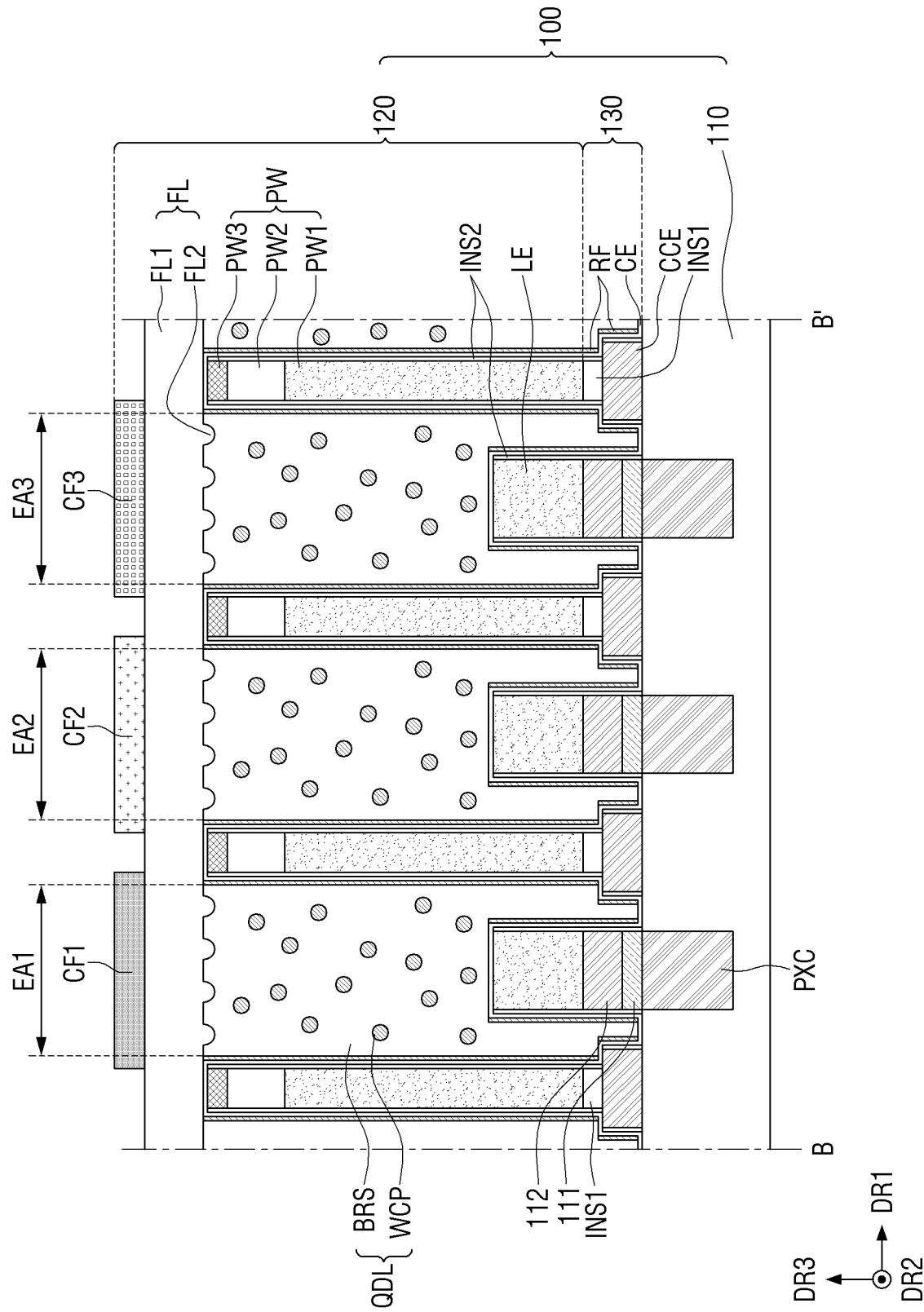
FIG. 5 is a cross-sectional view showing an example of the display panel taken along the line B-B' of FIG. 4.
Figure 6:
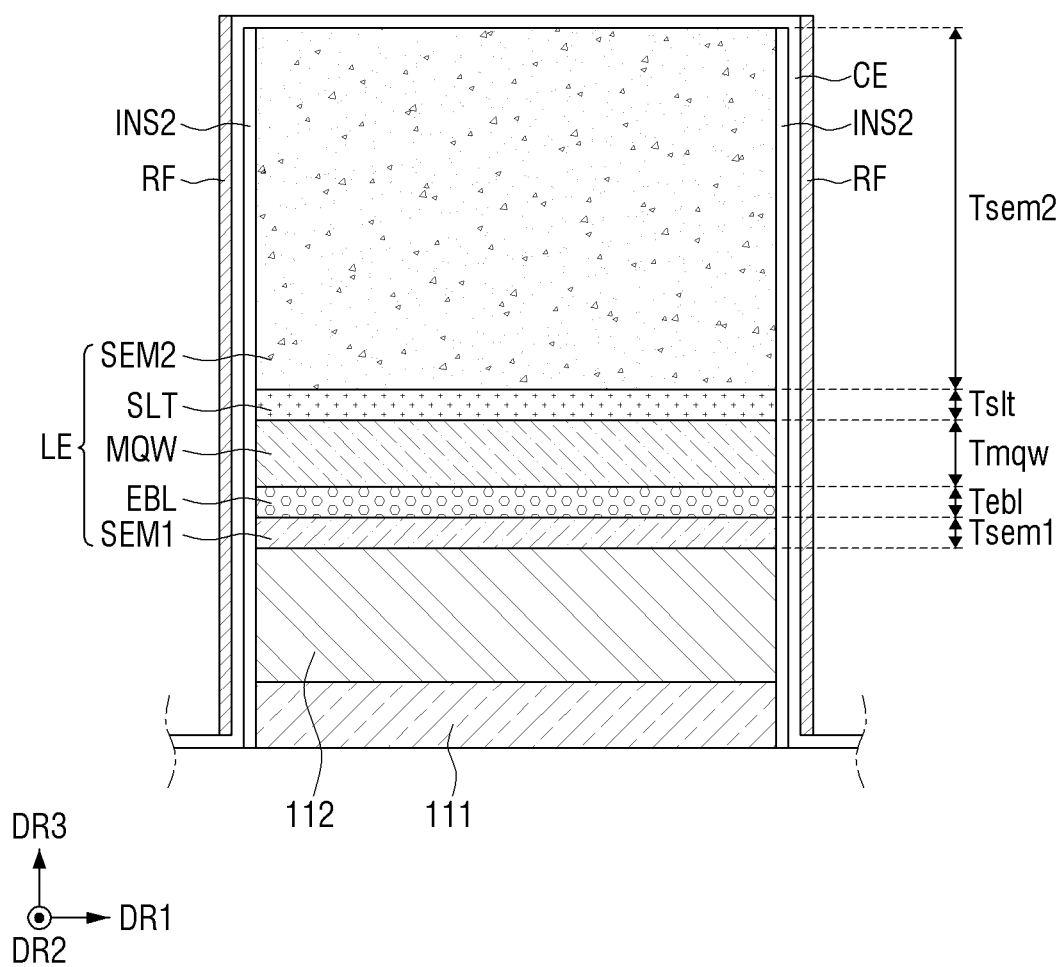
FIG. 6 is an enlarged cross-sectional view showing an example of a light-emitting element of FIG. 5.
Figure 7:
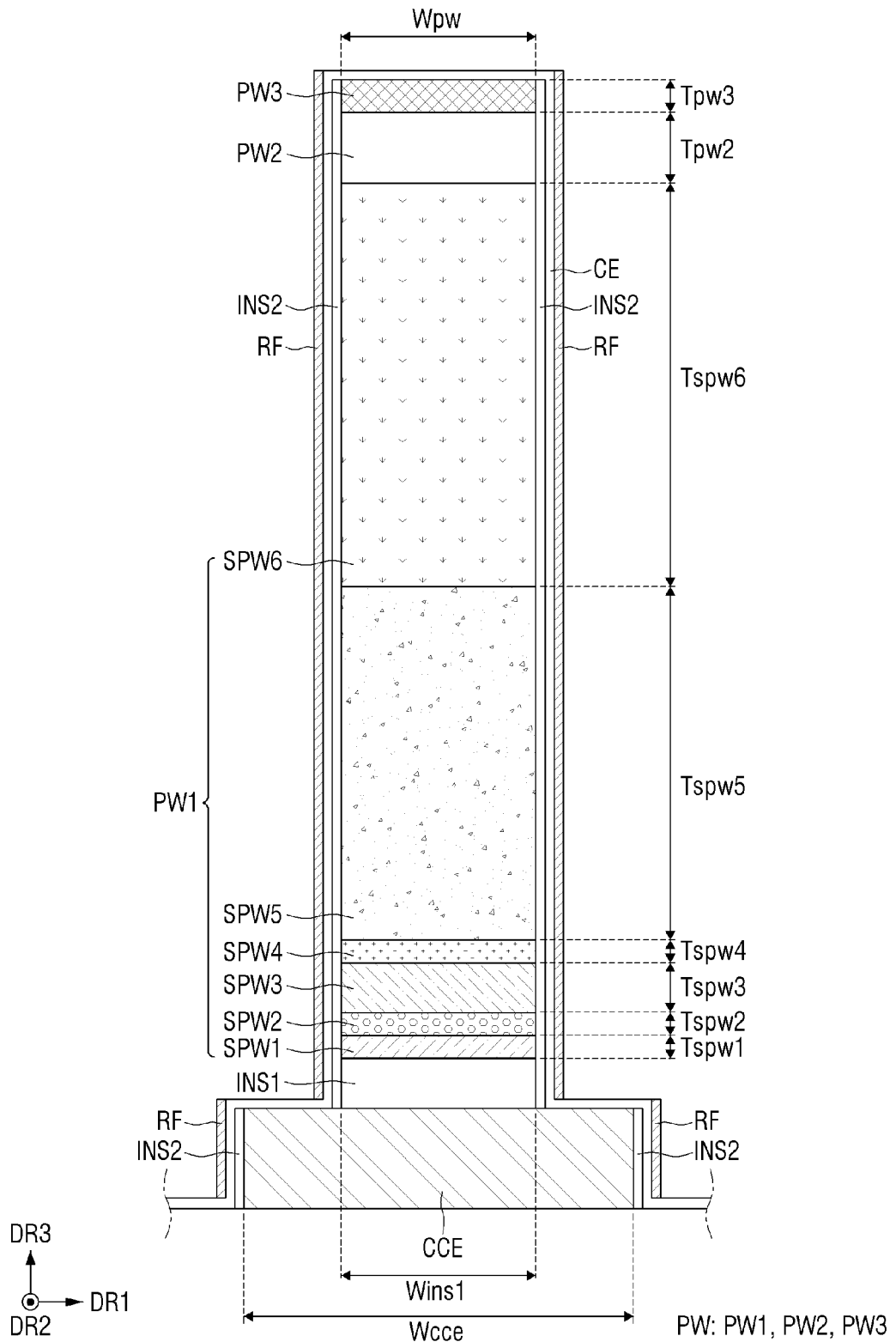
FIG. 7 is an enlarged cross-sectional view showing an example of a partition wall of FIG. 5.

FIG. 4 is a cross-sectional view showing an example of a display panel taken along the line A-A' of FIG. 2; FIG. 5 is a cross-sectional view showing an example of the display panel taken along the line B-B' of FIG. 4; FIG. 6 is an enlarged cross-sectional view showing an example of a light-emitting element of FIG. 5; and FIG. 7 is an enlarged cross-sectional view showing an example of a partition wall of FIG. 5.

Referring to FIGS. 4 to 7, the display panel 100 may include the semiconductor circuit board 110, a conductive connection layer 130, and a light-emitting element layer 120.

The semiconductor circuit board 110 may include a plurality of pixel circuits PXC and pixel electrodes 111. The conductive connection layer 130 may include connection electrodes 112, first pads PD1, the common connection electrode CCE, and a first insulating film INS1.

In an embodiment, the semiconductor circuit board 110 may be a silicon wafer substrate formed via a semiconductor process, and the plurality of pixel circuits PXC of the semiconductor circuit board 110 may be formed via a semiconductor process.

The plurality of pixel circuits PXC may be disposed in the display area DA. In an embodiment, the plurality of pixel circuits PXC may be connected to the pixel electrodes 111, respectively. In other words, the plurality of pixel circuits PXC and the plurality of pixel electrodes 111 may be connected in a one-to-one correspondence. Each of the plurality of pixel circuits PXC may overlap with the light-emitting element LE in the third direction DR3.

Each of the plurality of pixel circuits PXC may include at least one transistor formed via a semiconductor process. In addition, each of the plurality of pixel circuits PXC may further include at least one capacitor formed via a semiconductor process. Each of the plurality of pixel circuits PXC may apply a pixel voltage or an anode voltage to the pixel electrode 111.

The pixel electrodes 111 may be disposed on the pixel circuits PXC, respectively. In an embodiment, each of the pixel electrodes 111 may be an exposed electrode exposed from the respective pixel circuit PXC. In other words, each of the pixel electrodes 111 may protrude from an upper surface of the respective pixel circuit PXC. In an embodiment, the pixel electrodes 111 may be formed integrally with the pixel circuits PXC, respectively. Each of the pixel electrodes 111 may receive a pixel voltage or an anode voltage from the respective pixel circuit PXC. In an embodiment, the pixel electrodes 111 may be made of aluminum (Al).

The connection electrodes 112 may be disposed on the pixel electrodes 111, respectively. Each of the connection electrodes 112 may be disposed on the pixel electrode 111. The connection electrodes 112 may include a metal material to attach the pixel electrodes 111 to the light-emitting elements LE. For example, the connection electrodes 112 may include at least one of gold (Au), copper (Cu), aluminum (Al), and tin (Sn). In an embodiment, the connection electrodes 112 may include a first layer including one of gold (Au), copper (Cu), aluminum (Al), and tin (Sn), and a second layer including another one of gold (Au), copper (Cu), aluminum (Al), and tin (Sn). In this case, the second layer may be disposed on the first layer.

The common connection electrode CCE may be spaced apart from the pixel electrode 111 and the connection electrode 112. In an embodiment, the common connection electrode CCE may be disposed to surround the pixel electrode 111 and the connection electrode 112.

The common connection electrode CCE may be connected to one of the first pads PD1 of the first pad area PDA1 or one of the second pads of the second pad area PDA2 in the non-display area NDA to receive a common voltage. In an embodiment, the common connection electrode CCE may include a same material as the connection electrodes 112. For example, the common connection electrode CCE may include at least one of gold (Au), copper (Cu), aluminum (Al), and tin (Sn). In the case in which each of the connection electrodes 112 includes the first layer and the second layer, the common connection electrode CCE may include a same material as the first layer of each of the connection electrodes 112.

The first insulating film INS1 may be disposed on the common connection electrode CCE. In an embodiment, the first insulating film INS1 may be implemented as an inorganic film, such as any of a silicon oxide film ($SiO_2$), an aluminum oxide film ($Al_2O_3$) and a hafnium oxide film (HfOx). A width Wins1 of the first insulating film INS1 in the first direction DR1 or the second direction DR2 may be smaller than the width Wcce of the common connection electrode CCE. Accordingly, a part of the upper surface of the common connection electrode CCE may not be covered by the first insulating film INS1 but may be exposed. The part of the upper surface of the common connection electrode CCE that is not covered by the first insulating film INS1 but is exposed may be in contact with a common electrode CE. Therefore, the common electrode CE may be connected to the common connection electrode CCE.

Each of the first pads PD1 may be connected to a pad CPD of the circuit board CB through a conductive connection member such as a wire WR associated therewith. That is, the first pads PD1, the wires WR, and the pads CPD of the circuit board CB may be connected to one another, respectively.

Each of the first pads PD1 may include a first pad electrode PDE1 and a second pad electrode PDE2. In an embodiment, the first pad electrode PDE1 may include a same material as the pixel electrode 111. In an embodiment, the second pad electrode PDE2 may include a same material as the connection electrodes 112. For example, the second pad electrode PDE2 may include at least one of gold (Au), copper (Cu), aluminum (Al), and tin (Sn). In an embodiment, in the case in which each of the connection electrodes 112 includes the first layer and the second layer, the second pad electrode PDE2 may also include a first layer and a second layer.

The semiconductor circuit board 110 and the circuit board CB may be disposed on a base substrate BSUB. The semiconductor circuit board 110 and the circuit board CB may be attached to an upper surface of the base substrate BSUB using an adhesive member such as a pressure sensitive adhesive.

The circuit board CB may be any of a flexible film, such as a flexible printed circuit board (FPCB), a printed circuit board (PCB), a flexible printed circuit (FPC), and a chip-on-film (COF).

The second pads of the second pad area PDA2 may be the same (same or substantially same) as the first pads PD1 described above with reference to FIGS. 4 and 5; and, therefore, redundant descriptions thereof will be omitted.

The light-emitting element layer 120 may include the light-emitting elements LE, the partition wall PW, a second insulating film INS2, the common electrode CE, a reflective film RF, a protective film, a wavelength conversion layer QDL, an optical member FL, and a plurality of color filters CF1, CF2, and CF3.

The light-emitting element layer 120 may include first emission areas EA1, second emission areas EA2, and third emission areas EA3 partitioned by the partition wall PW. In each of the first emission areas EA1, the second emission areas EA2, and the third emission areas EA3, one of the light-emitting elements LE, the protective film, the wavelength conversion layer QDL, and the plurality of color filters CF1, CF2, and CF3 may be disposed.

The light-emitting element LE may be disposed on the connection electrode 112 in each of the first emission areas EA1, the second emission areas EA2, and the third emission areas EA3. The light-emitting element LE may be a vertical light-emitting diode extended in the third direction DR3. That is, a length of the light-emitting element LE in the third direction DR3 may be larger than a length in the horizontal direction. The horizontal length refers to either the length in the first direction DR1 or the length in the second direction DR2. In an embodiment, for example, the length of the light-emitting element LE in the third direction DR3 may be approximately 1 to 5 μm.

The light-emitting element LE may be a micro light-emitting diode. In an embodiment, the light-emitting element LE includes a first semiconductor layer SEMI, an electron blocking layer EBL, an active layer MQW, a superlattice layer SLT, and a second semiconductor layer SEM2 in the third direction DR3, as shown in FIG. 6. The first semiconductor layer SEMI, the electron blocking layer EBL, the active layer MQW, the superlattice layer SLT, and the second semiconductor layer SEM2 may be stacked on one another in this order in the third direction DR3.

The first semiconductor layer SEMI may be disposed on the connection electrode 112. The first semiconductor layer SEMI may be doped with a dopant of a first conductivity type, such as any of Mg, Zn, Ca, Se, and Ba. For example, the first semiconductor layer SEMI may be p-GaN doped with p-type Mg. In an embodiment, a thickness of the first semiconductor layer SEMI may be in a range approximately from 30 to 200 nm.

The electron blocking layer EBL may be disposed on the first semiconductor layer SEMI. The electron blocking layer EBL may suppress or prevent too many electrons from flowing into the active layer MQW. For example, the electron blocking layer EBL may be p-AlGaN doped with p-type Mg. In an embodiment, a thickness of the electron blocking layer EBL may be approximately 10 to 50 nm. However, in an embodiment, the electron blocking layer EBL may be omitted.

The active layer MQW may be disposed on the electron blocking layer EBL. The active layer MQW may emit light as electron-hole pairs are combined therein in response to an electrical signal applied through the first semiconductor layer SEMI and the second semiconductor layer SEM2. In an embodiment, the active layer MQW may emit first light having a central wavelength range of 450 nm to 495 nm, i.e., light of the blue wavelength range.

The active layer MQW may include a material having a single or multiple quantum well structure. In an embodiment, when the active layer MQW includes a material having the multiple quantum well structure, well layers and barrier layers may be alternately stacked on one another in the structure. In an embodiment, the well layers may be made of InGaN, and the barrier layers may be made of GaN or AlGaN, but embodiments of the present disclosure are not limited thereto. In an embodiment, a thickness of the well layers may be approximately 1 to 4 nm, and a thickness of the barrier layers may be 3 to 10 nm.

In an embodiment, the active layer MQW may have a structure in which a semiconductor material having a large band gap energy and a semiconductor material having a small band gap energy are alternately stacked on one another, and may include other Group III to Group V semiconductor materials, depending on a wavelength range of the emitted light. The light emitted by the active layer MQW is not limited to the first light (light in the blue wavelength range). In some implementations, the second light (light in the green wavelength range) or the third light (light in the red wavelength range) may be emitted by the active layer MQW.

The superlattice layer SLT may be disposed on the active layer MQW. The superlattice layer SLT may relieve stress between the second semiconductor layer SEM2 and the active layer MQW. For example, the superlattice layer SLT may be made of InGaN or GaN. In an embodiment, a thickness of the superlattice layer SLT may be approximately 50 to 200 nm. However, in an embodiment, the superlattice layer SLT may be omitted.

The second semiconductor layer SEM2 may be disposed on the superlattice layer SLT. The second semiconductor layer SEM2 may be doped with a dopant of a second conductivity type, such as any of Si, Ge, and Sn. For example, the second semiconductor layer SEM2 may be n-GaN doped with n-type Si. In an embodiment, a thickness of the second semiconductor layer SEM2 may be in a range approximately from 2 to 4 μm.

The partition wall PW may be spaced apart from the light-emitting element LE disposed in each of the first emission areas EA1, the second emission areas EA2, and the third emission areas EA3. In an embodiment, the partition wall PW may be disposed to surround the light-emitting element LE disposed in each of the first emission areas EA1, the second emission areas EA2, and the third emission areas EA3.

The partition wall PW may be disposed on the common connection electrode CCE. The width Wpw of the partition wall PW in the first direction DR1 and the second direction DR2 may be smaller than the width Wcce of the common connection electrode CCE. The partition wall PW may be spaced apart from the light-emitting elements LE.

In an embodiment, the partition wall PW may include a first partition wall PW1, a second partition wall PW2, and a third partition wall PW3.

The first partition wall PW1 may be disposed on the first insulating film INS1. In an embodiment, the first partition wall PW1 is formed via a same process with the light-emitting element LE, and at least a part of the first partition wall PW1 may include a same material as that of the light-emitting element LE.

In an embodiment, the first partition wall PW1 may include a plurality of subsidiary partition walls SPW1 to SPW6 sequentially stacked on one another in the third direction DR3. For example, the first partition wall PW1 may include a first subsidiary partition wall SPW1, a second subsidiary partition wall SPW2, a third subsidiary partition wall SPW3, a fourth subsidiary partition wall SPW4, a fifth subsidiary partition wall SPW5, and a sixth subsidiary partition wall SPW6.

The first subsidiary partition wall SPW1 may be made of a same material as the first semiconductor layer SEMI of the light-emitting element LE. The first subsidiary partition wall SPW1 may be formed via a same process with the first semiconductor layer SEMI of the light-emitting element LE. A thickness Tspw1 of the first subsidiary partition wall SPW1 may be equal (equal or substantially equal) to a thickness Tsem1 of the first semiconductor layer SEMI of the light-emitting element LE.

The second subsidiary partition wall SPW2 may be made of a same material as the electron blocking layer EBL of the light-emitting element LE. The second subsidiary partition wall SPW2 may be formed via a same process with the electron blocking layer EBL of the light-emitting element LE. A thickness Tspw2 of the second subsidiary partition wall SPW2 may be equal (equal or substantially equal) to a thickness Tebl of the electronic blocking layer EBL of the light-emitting element LE. In an embodiment in which the electron blocking layer EBL is omitted, the second subsidiary partition wall SPW2 may also be omitted.

The third subsidiary partition wall SPW3 may be made of a same material as the active layer MQW of the light-emitting element LE. The third subsidiary partition wall SPW3 may be formed via a same process with the active layer MQW of the light-emitting element LE. A thickness Tspw3 of the third subsidiary partition wall SPW3 may be equal (equal or substantially equal) to a thickness Tmqw of the active layer MQW of the light-emitting element LE.

The fourth subsidiary partition wall SPW4 may be made of a same material as the superlattice layer SLT of the light-emitting element LE. The fourth subsidiary partition wall SPW4 may be formed via a same process with the superlattice layer SLT of the light-emitting element LE. A thickness Tspw4 of the fourth subsidiary partition wall SPW4 may be equal (equal or substantially equal) to a thickness Tslt of the superlattice layer SLT of the light-emitting element LE.

The fifth subsidiary partition wall SPW5 may be made of a same material as the second semiconductor layer SEM2 of the light-emitting element LE. The fifth subsidiary partition wall SPW5 may be formed via a same process with the second semiconductor layer SEM2 of the light-emitting element LE. In an embodiment, during a process of fabricating the display panel 100, the fifth subsidiary partition wall SPW5 is not removed, but a part of the second semiconductor layer SEM2 of the light-emitting element LE is removed. As a result, a thickness Tspw5 of the fifth subsidiary partition wall SPW5 may be greater than a thickness Tsem2 of the second semiconductor layer SEM2 of the light-emitting element LE.

In an embodiment, the sixth subsidiary partition wall SPW6 may be implemented as a semiconductor layer that is not doped with a dopant, i.e., an undoped semiconductor layer. For example, the sixth subsidiary partition wall SPW6 may be GaN not doped with a dopant. In an embodiment, a thickness Tspw6 of the sixth subsidiary partition wall SPW6 may be greater than the thickness Tsem2 of the second semiconductor layer SEM2 of the light-emitting element LE. In an embodiment, the thickness Tspw6 of the sixth subsidiary partition wall SPW6 may be approximately 2 to 3 μm.

The second partition wall PW2 and the third partition wall PW3 may function as a mask for preventing or substantially preventing the first partition wall PW1 from being etched during a process of forming the light-emitting element LE and the partition wall PW.

The second partition wall PW2 may be disposed on the first partition wall PW1. In an embodiment, the second partition wall PW2 may be implemented as an inorganic film, such as any of a silicon oxide film ($SiO_2$), an aluminum oxide film ($Al_2O_3$), and a hafnium oxide film (HfOx). In an embodiment, a thickness Tpw2 of the second partition wall PW2 may be approximately 1 to 2 μm.

The third partition wall PW3 may be disposed on the second partition wall PW2. The third partition wall PW3 may include a conductive material, such as nickel (Ni). In an embodiment, a thickness Tpw3 of the third partition wall PW3 may be approximately 0.01 to 1 μm.

The second insulating film INS2 may be disposed on side surfaces of the common connection electrode CCE, side surfaces of the partition wall PW, side surfaces of each of the pixel electrodes 111, side surfaces of each of the connection electrodes 112, and side surfaces of each of the light-emitting elements LE. In an embodiment, the second insulating film INS2 may be implemented as an inorganic film, such as any of a silicon oxide film ($SiO_2$), an aluminum oxide film ($Al_2O_3$), and a hafnium oxide film (HfOx). In an embodiment, a thickness of the second insulating film INS2 may be approximately 0.1 μm.

The common electrode CE may be disposed on the upper and side surfaces of each of the light-emitting elements LE and the upper and side surfaces of the partition wall PW. That is, the common electrode CE may be disposed to cover the upper and side surfaces of each of the light-emitting elements LE and the upper and side surfaces of the partition wall PW.

The common electrode CE may be in contact with the second insulating film INS2 disposed on the side surfaces of the common connection electrode CCE, the side surfaces of the partition wall PW, the side surfaces of each of the pixel electrodes 111, the side surfaces of each of the connection electrodes 112, and the side surfaces of each of the light-emitting elements LE. In addition, the common electrode CE may be in contact with the upper surface of the common connection electrode CCE, the upper surface of each of the light-emitting elements LE, and the upper surface of the partition wall PW.

The common electrode CE may be in contact with the upper surface of the common connection electrode CCE and the upper surface of the light-emitting element LE that are not covered by the second insulating film INS2. Therefore, the common voltage supplied to the common connection electrode CCE may be applied to the light-emitting element LE. That is, a first end of the light-emitting element LE may receive the pixel voltage or the anode voltage of the pixel electrode 111 through the connection electrode 112, and a second end of the light-emitting element LE may receive the common voltage through the common electrode CE. The light-emitting element LE may emit light with a luminance (e.g., a predetermined luminance) according to a voltage difference between the pixel voltage and the common voltage.

The common electrode CE may include a transparent conductive material. In an embodiment, the common electrode CE may be made of a transparent conductive oxide (TCO), such as any of indium tin oxide (ITO) and indium zinc oxide (IZO). In an embodiment, a thickness of the common electrode CE may be approximately 0.1 μm.

The reflective film RF serves to reflect some of the lights emitted from the light-emitting element LE which travel in directions other than the vertical direction. The reflective film RF may include a metal material having high reflectivity, such as aluminum (Al). In an embodiment, a thickness of the reflective film RF may be approximately 0.1 μm.

The reflective film RF may be disposed on side surfaces of the common connection electrode CCE, side surfaces of the partition wall PW, side surfaces of each of the pixel electrodes 111, side surfaces of each of the connection electrodes 112, and side surfaces of each of the light-emitting elements LE. The reflective film RF may be in contact with the common electrode CE first on side surfaces of the common connection electrode CCE, side surfaces of the partition wall PW, side surfaces of each of the pixel electrodes 111, side surfaces of each of the connection electrodes 112, and side surfaces of each of the light-emitting elements LE.

The wavelength conversion layer QDL may be disposed on the protective film in each of the first emission areas EA1, the second emission areas EA2, and the third emission areas EA3. In an embodiment, the wavelength conversion layer QDL may convert a part of the first light incident from the light-emitting element LE into fourth light to output the fourth light. For example, the fourth light may be light in a yellow wavelength range. The fourth light may include both a green wavelength range and a red wavelength range. In other words, the fourth light may be a mixture of the second light and the third light.

The wavelength conversion layer QDL may include a base resin BRS and wavelength conversion particles WCP. The base resin BRS may include a transparent organic material. For example, the base resin BRS may include an epoxy resin, an acrylic resin, a cardo resin, or an imide resin.

The wavelength conversion particles WCP may convert the first light incident from the light emitting element LE into the fourth light. For example, the wavelength conversion particles WCP may convert light in the blue wavelength range into light in the yellow wavelength range. In an embodiment, the wavelength conversion particles may be quantum dots (QD), quantum rods, fluorescent material, or phosphorescent material. In an embodiment, the quantum dots may include IV nanocrystals, II-VI compound nanocrystals, III-V compound nanocrystals, IV-VI nanocrystals, or combinations thereof.

A quantum dot may include a core and a shell overcoating the core. The core may include, but is not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si, and Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The wavelength conversion layer QDL may further include scatterers for scattering the light of the light-emitting element LE in random directions. The scatterers may include metal oxide particles or organic particles. For example, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). In an embodiment, the organic particles may include an acrylic resin or a urethane-based resin. In an embodiment, the diameter of the scatterers may be several to several tens of nanometers.

The optical member FL may be disposed on the wavelength conversion layer QDL and the partition wall PW. The optical member FL may adjust paths of lights output from the wavelength conversion layer QDL. The optical member FL may serve to focus the light output from the wavelength conversion layer QDL toward the center of each of the emission area areas EA1, EA2 and EA3. By adjusting the refractive index of the optical member FL to be different from that of the underlying wavelength conversion layer QDL adjacent thereto, and the optical member FL includes a protruding pattern protruding toward the wavelength converting layer QDL, it is possible to adjust the paths of the lights. In an embodiment, the refractive index of the optical member FL may be greater than the refractive index of the underlying wavelength conversion layer QDL adjacent thereto, and the optical member FL includes an optical layer FL1 and a first protrusion pattern FL2 protruding toward the wavelength conversion layer QDL from the optical layer FL1.

The optical layer FL1 of the optical member FL may be in direct contact with the color filters CF1, CF2, and CF3, and the first protruding pattern FL2 of the optical member FL may be in direct contact with the base resin BRS of the wavelength conversion layer QDL. In an embodiment, a thickness T1 of the optical layer FL1 may be, but is not limited to, approximately 10 μm to 14 μm.

The optical layer FL1 and the first protrusion pattern FL2 may be directly connected to each other. The optical layer FL1 and the first protrusion pattern FL2 may be formed as a single piece. The first protrusion pattern FL2 may be formed via a photomask process or a rubbing process. However, embodiments are not limited thereto.

In an embodiment, a cross-sectional shape of the first protrusion pattern FL2 may include a lens shape that is convex downward. For example, as shown in FIG. 4, a plurality of first protrusion patterns FL2 may be disposed. In an embodiment, the plurality of first protrusion patterns FL2 is disposed in each of the emission areas EA1, EA2, and EA3, and a width W2 (see FIG. 9) of one first protrusion pattern FL2 may be smaller than a distance DPW between the partition wall PW and another adjacent partition wall. Although the width W2 of the first protruding patterns FL2 may be smaller than a width W1 of the light-emitting element LE, embodiments of the present disclosure are not limited thereto. The width W2 of the first protruding patterns FL2 may be equal to or greater than the width W1 of the light-emitting element LE. In an embodiment, a thickness T2 of the first protruding patterns FL2 may be less than ½ of the distance DPW between the partition walls PW, but embodiments of the present disclosure are not limited thereto.

The plurality of first protruding patterns FL2 may focus the first to third light transmitted from the wavelength conversion layers QDL in each of the emission areas EA1, EA2, and EA3. The arrangement of the first protruding patterns FL2 and the focusing of the first to third lights by the first protruding patterns FL2 will be described further with reference to FIGS. 8 and 9.

The plurality of color filters CF1, CF2, and CF3 may include first color filters CF1, second color filters CF2, and third color filters CF3. The plurality of color filters CF1, CF2, and CF3 may be disposed on the optical member FL.

Each of the first color filters CF1 may be disposed on the optical member FL in the first emission area EA1. In addition, each of the first color filters CF1 may be disposed on the partition wall PW. Each of the first color filters CF1 may transmit the first light and may absorb or block the fourth light. For example, each of the first color filters CF1 may transmit light in the blue wavelength range and may absorb or block light in the green and red wavelength ranges. Therefore, each of the first color filters CF1 may transmit the first light that is not converted by the wavelength conversion layer QDL from among the first lights emitted from the light-emitting elements LE, and may absorb or block the fourth light that is converted by the wavelength conversion layer QDL. Accordingly, each of the first emission areas EA1 may emit the first light.

Each of the second color filters CF2 may be disposed on the optical member FL in the second emission area EA2. In addition, each of the second color filters CF2 may be disposed on the partition wall PW. Each of the second color filters CF2 may transmit the second light and may absorb or block the first light and the third light. For example, each of the second color filters CF2 may transmit light in the green wavelength range and may absorb or block light in the blue and red wavelength ranges. Therefore, each of the second color filters CF2 may absorb or block the first light that is not converted by the wavelength conversion layer QDL from among the first lights emitted from the light-emitting elements LE. In addition, each of the second color filters CF2 may transmit the second light in the green wavelength range from among the fourth light converted by the wavelength conversion layer QDL and may absorb or block the third light in the red wavelength range. Accordingly, each of the second emission areas EA2 may emit the second light.

Each of the third color filters CF3 may be disposed on the optical member FL in the third emission area EA3. In addition, each of the third color filters CF3 may be disposed on the partition wall PW. Each of the third color filters CF3 may transmit the third light and may absorb or block the first light and the second light. For example, each of the third color filters CF3 may transmit light in the red wavelength range and may absorb or block light in the blue and green wavelength ranges. Therefore, each of the third color filters CF3 may absorb or block the first light that is not converted by the wavelength conversion layer QDL from among the first lights emitted from the light-emitting elements LE. In addition, each of the third color filters CF3 may transmit the third light in the red wavelength range from among the fourth light converted by the wavelength conversion layer QDL and may absorb or block the second light in the green wavelength range. Accordingly, each of the third emission areas EA3 may emit the third light.

Figure 8:
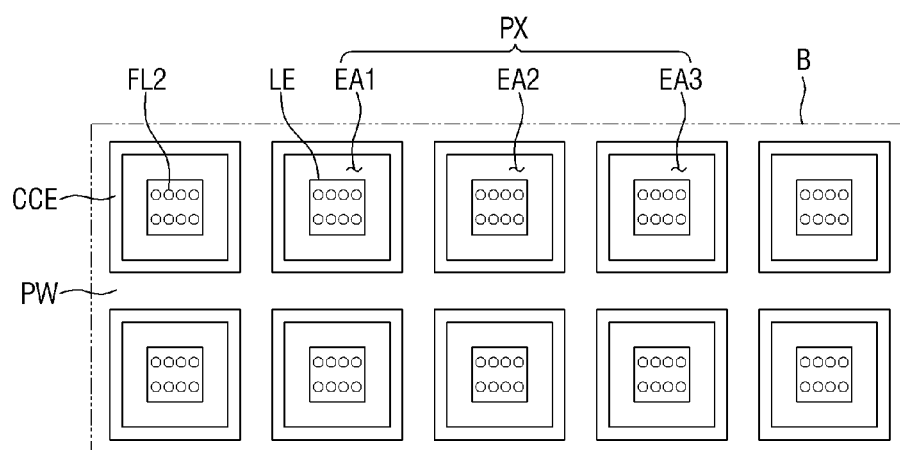
FIG. 8 is a view showing a layout of pixels and optical patterns, corresponding to a region "B" shown in FIG. 2, according to an embodiment of the present disclosure.
Figure 9:
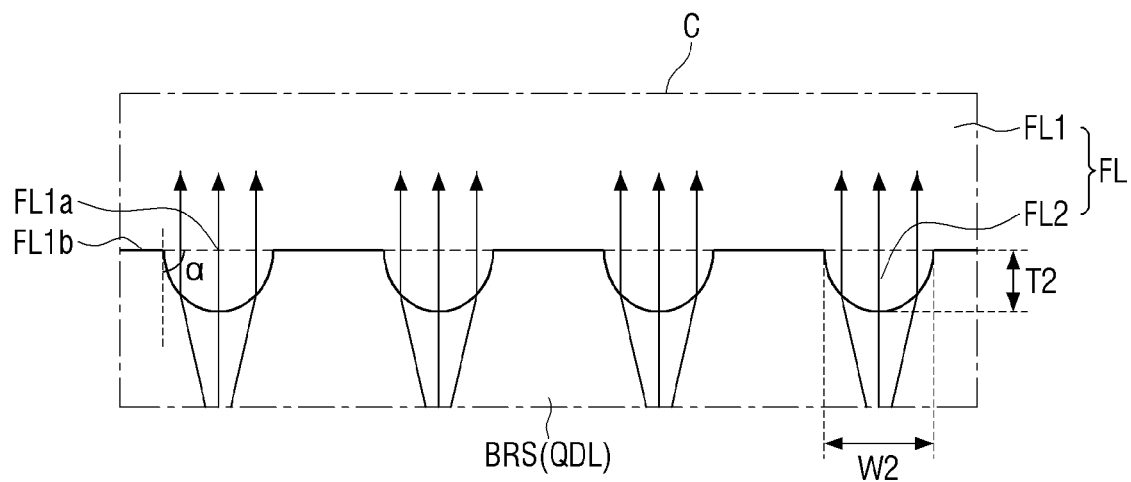
FIG. 9 is an enlarged cross-sectional view of a region "C" of FIG. 4.
Figure 10A:
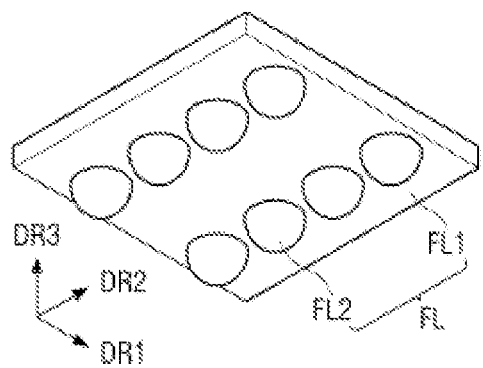
FIGS. 10A to 10E are perspective views showing a variety of modifications of the optical patterns.
Figure 10B:
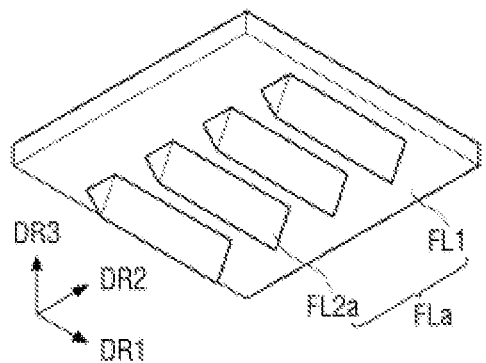
Figure 10C:
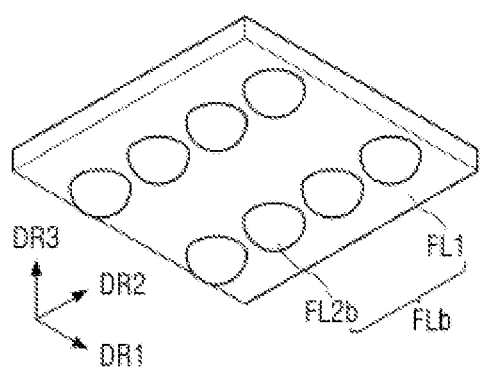
Figure 10D:
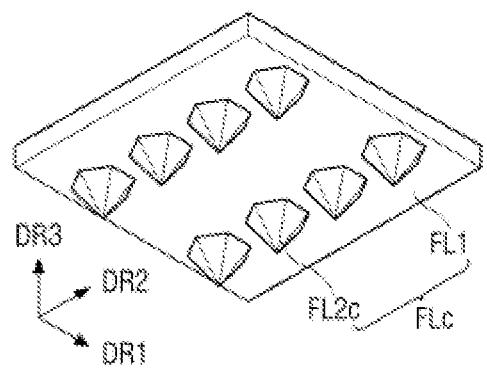
Figure 10E:
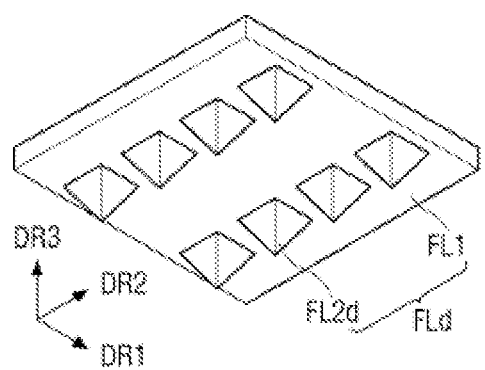

FIG. 8 is a view showing a layout of pixels and optical patterns, corresponding to a region "B" shown in FIG. 2, according to an embodiment of the present disclosure; and FIG. 9 is an enlarged cross-sectional view of a region "C" of FIG. 4.

In an embodiment, referring to FIG. 8, the plurality of first protruding patterns FL2 may be disposed in each of the emission areas EA1, EA2, and EA3. Although the plurality of first protruding patterns FL2 is shown regularly arranged along the first direction DR1 and the second direction DR2 in the example shown in FIG. 8 for convenience of illustration, embodiments of the present disclosure are not limited thereto. In an embodiment, the plurality of first protruding patterns FL2 may be arranged randomly. In the example shown in FIG. 8, four first protruding patterns FL2 are arranged in the first direction DR1 and two first protruding patterns FL2 are arranged in the second direction DR2; however, the number of the plurality of first protruding patterns FL2 is not limited thereto.

As described above, the plurality of first protruding patterns FL2 may focus the first to third light transmitted from the wavelength conversion layer QDL in each of the emission areas EA1, EA2, and EA3. As shown in FIG. 9, the third light transmitted from the base resin BRS of the wavelength conversion layer QDL of the third emission area EA3 may include not only lights traveling straight in the vertical direction, but also lights traveling in directions oblique to the vertical direction at certain angles. The lights traveling in directions oblique to the vertical direction at certain angles may be directed by the first protruding patterns FL2 so as to travel in directions less oblique to the vertical direction.

In order to direct by the first protruding patterns FL2 the lights traveling in directions oblique to the vertical direction by certain angles so as to travel in directions less oblique to the vertical direction, a difference in the refractive index between the first protruding patterns FL2 and the adjacent element and the shape of the first protruding patterns FL2 are adjusted.

As described above, the first protruding patterns FL2 may be made of a same material as the optical layer FL1, and the refractive index of the optical member FL may be greater than that of the underlying base resin BRS adjacent thereto. Accordingly, it is possible to focus the lights traveling in directions oblique to the vertical direction among the third lights transmitted from the base resin BRS at the interface between the first protruding patterns FL2 and the base resin BRS such that the lights travel in directions less oblique to the vertical direction (lights are focused toward the center of the emission area EMA3).

Further, it is possible to focus the third lights transmitted from the base resin BRS toward the center of the emission area EA3 more reliably if the refractive index of the first protruding patterns FL2 is greater than that of the base resin BRS, and the cross-sectional shape of the first protruding patterns FL2 is in the shape of a converging lens which is typically used for focusing light. In an embodiment, a converging lens has an initial angle a of 30 degrees or more. Here, the initial angle a refers to the angle between an extended line connecting a lower surface FL1a of the optical layer FL1 in contact with the first protruding pattern FL2 with a lower surface FL1b of the optical layer FL1 exposed by the first protruding pattern FL2 and a tangent line at a point where the extended line meets the convex surface of the first protruding pattern FL1, as shown in FIG. 9.

FIGS. 10A to 10E are perspective views showing a variety of modifications of the optical patterns.

Referring to FIGS. 10A to 10E, optical patterns may have a downwardly protruding shape. The first protruding patterns FL2 according to the embodiment of FIG. 10A have a lens shape that is convex downward, and first protruding patterns FL2a according to the embodiment FIG. 10B have a prism shape. The first protruding patterns FL2 may be extended in the second direction DR2 and may be arranged in the first direction DR1. The first protruding patterns FL2b according to the embodiment of FIG. 10C may have a spherical shape that is convex upward. The first protruding patterns FL2c according to the embodiment of FIG. 10D may have a hexagonal pyramid shape that protrudes downward. The first protruding patterns FL2d according to the embodiment of FIG. 10E may have a quadrangular pyramid shape that protrudes downward.

Figure 11:
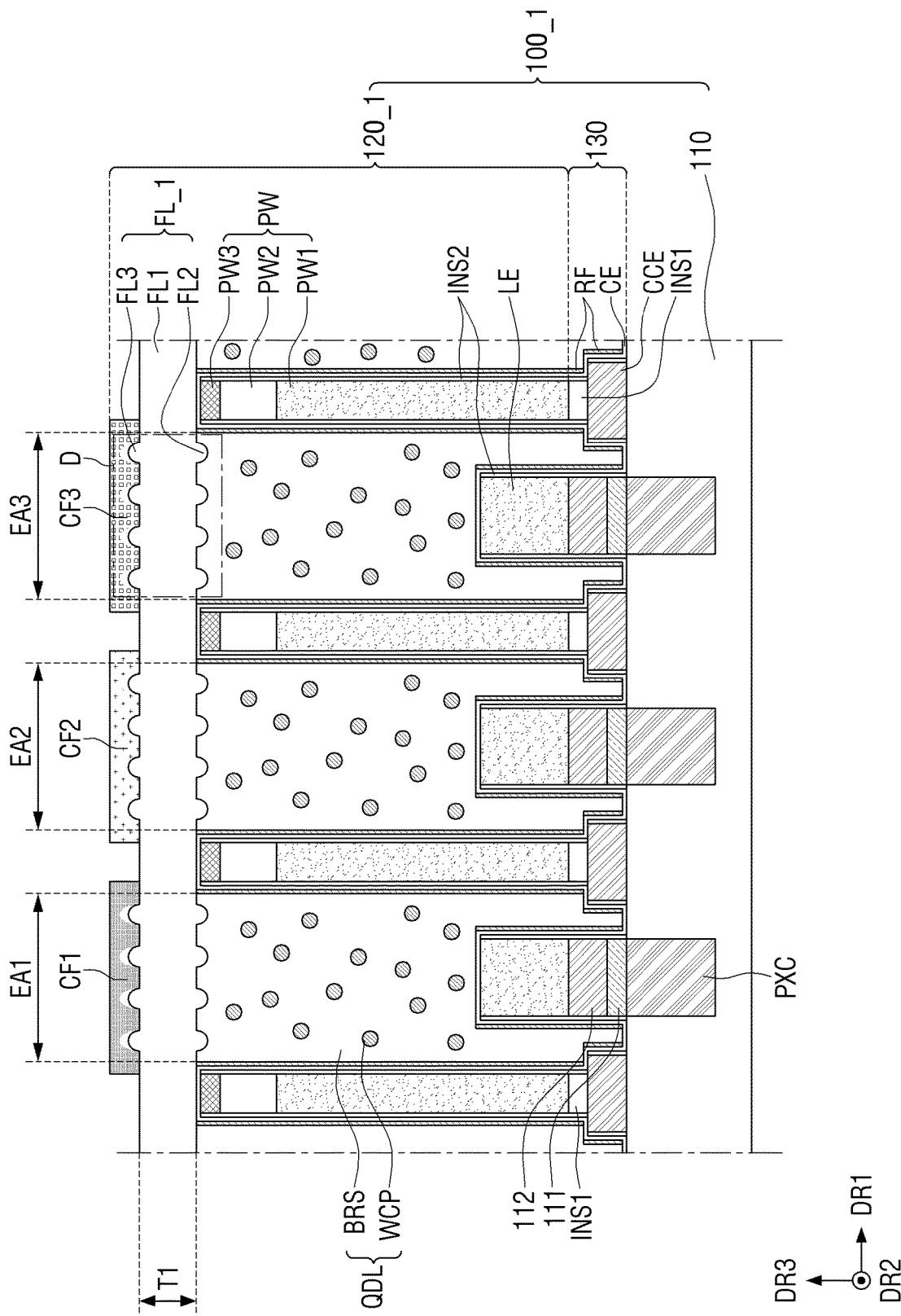
FIG. 11 is a cross-sectional view showing an example of a display panel according to another embodiment of the present disclosure.
Figure 12:
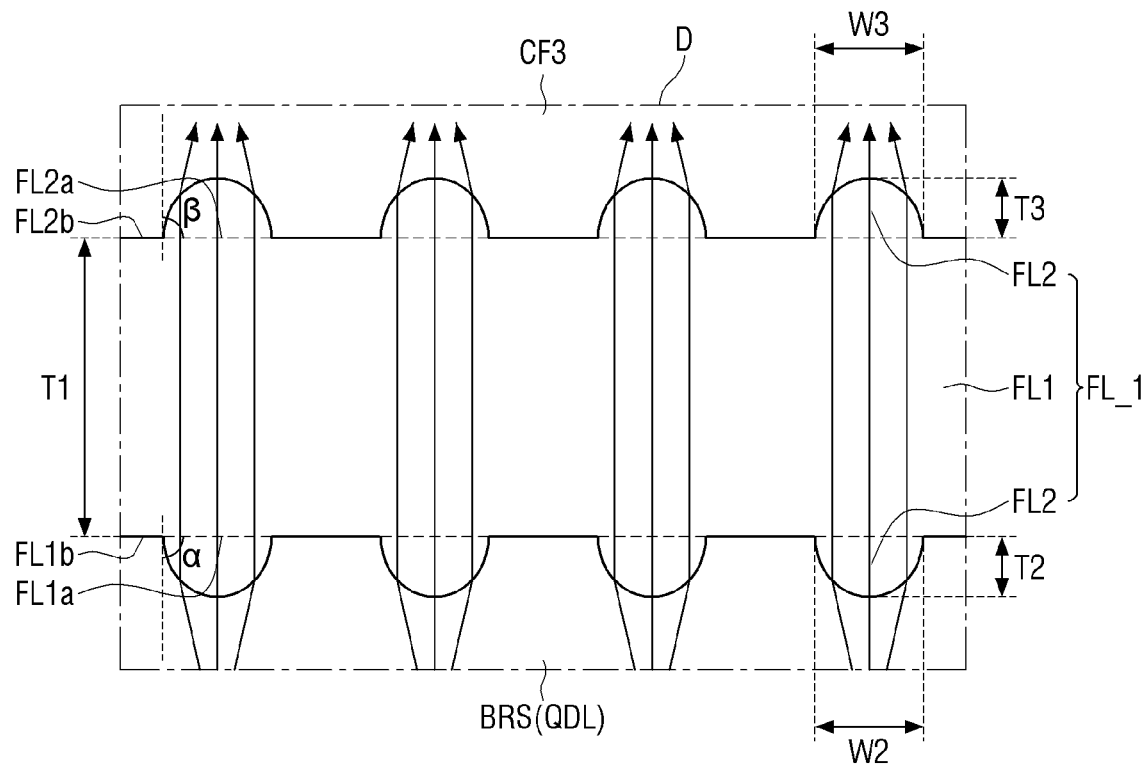
FIG. 12 is an enlarged cross-sectional view of a region "D" of FIG. 11.

FIG. 11 is a cross-sectional view showing an example of a display panel according to another embodiment of the present disclosure; and FIG. 12 is an enlarged cross-sectional view of a region "D" of FIG. 11.

Referring to FIGS. 11 and 12, an optical member FL_1 of a light-emitting element layer 120_1 of a display panel 100_1 according to an embodiment may further include a second protrusion pattern FL3 protruding upward from the optical layer FL1. The plurality of first protrusion patterns FL2 and the plurality of second protrusion patterns FL3 may overlap each other in the thickness direction.

The second protruding patterns FL3 of the optical member FL_1 may be in direct contact with the color filters CF1, CF2, and CF3. The optical layer FL1 and the second protruding patterns FL3 may be directly connected to each other. In an embodiment, the optical layer FL1 and the second protruding patterns FL3 may be formed as a single piece. In an embodiment, the second protruding patterns FL3 may be formed via a photomask process or a rubbing process. It is to be understood, however, that embodiments of the present disclosure are not limited thereto.

In an embodiment, a cross-sectional shape of the second protruding patterns FL3 is the same (same or substantially the same) as the cross-sectional shape of the first protruding patterns FL2 except that it is convex upward; and, therefore, redundant descriptions thereof will be omitted.

As shown in FIG. 11, a plurality of second protruding patterns FL3 may be disposed. Since the plurality of second protruding patterns FL3 is disposed in each of the emission areas EA1, EA2, and EA3, a width W3 of one second protrusion pattern FL3 may be smaller than the distance DPW between the partition wall PW and another adjacent partition wall. Although the width W3 of the second protruding patterns FL3 may be smaller than the width W1 of the light-emitting element LE, embodiments of the present disclosure are not limited thereto. In an embodiment, the width W3 of the second protruding patterns FL3 may be equal to or greater than the width W1 of the light-emitting element LE. In an embodiment, a thickness T3 of the second protruding patterns FL3 may be less than ½ of the distance DPW between the partition walls PW, but the present disclosure is not limited thereto.

The plurality of second protruding patterns FL3 may focus the first to third light transmitted from the optical layer FL1 in each of the emission areas EA1, EA2, and EA3.

Like the first protruding patterns FL2, it is possible to focus the third lights transmitted from the optical layer FL1 toward the center of the emission area EA3 more reliably if the refractive index of the second protruding patterns FL3 is greater than that of the color filters CF1, CF2, and CF3, and the cross-sectional shape of the second protruding patterns FL3 is in the shape of a converging lens which is used for focusing light. Accordingly, in an embodiment, the second protruding patterns FL3 have an initial angle β of 30 degrees or more. Here, the initial angle β refers to the angle between an extended line connecting an upper surface FL2a of the optical layer FL1 in contact with the second protruding pattern FL3 with an upper surface FL2b of the optical layer FL1 exposed by the second protruding pattern FL3 and a tangent line at a point where the extended line meets the convex surface of the second protruding pattern FL3, as shown in FIG. 12.

Figure 13:
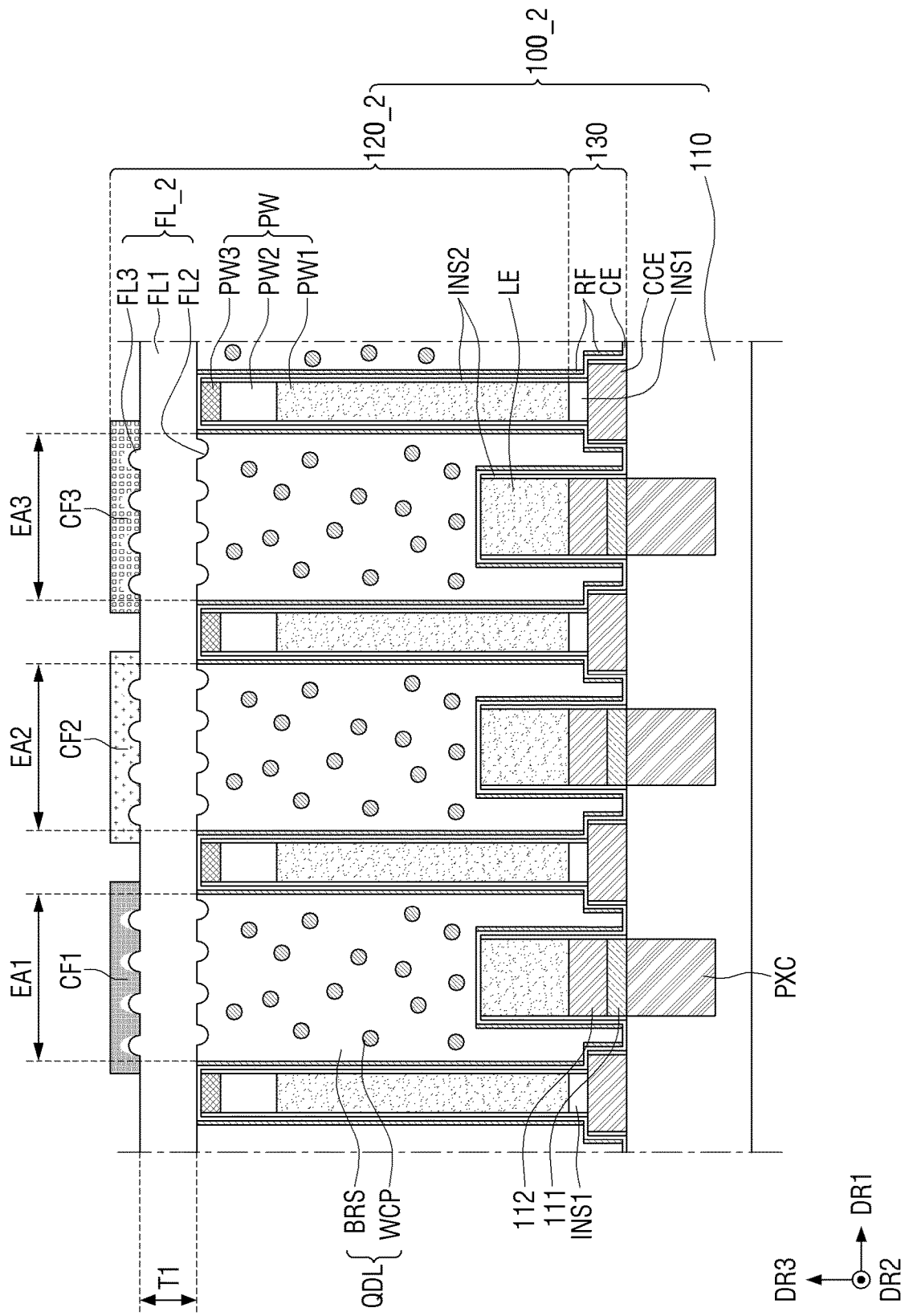
FIG. 13 is a cross-sectional view showing an example of a display panel according to another embodiment of the present disclosure.

FIG. 13 is a cross-sectional view showing an example of a display panel according to another embodiment of the present disclosure.

A display panel 100_2 according to the embodiment of FIG. 13 is different from the display panel 100_1 according to the embodiment of FIG. 11 in that parts of first protruding patterns FL2 and second protruding patterns FL3 of an optical member FL_2 of a light-emitting element layer 120_2 overlap each other in the thickness direction, and other parts of the first protruding patterns FL2 and the second protruding patterns FL3 do not overlap each other in the thickness direction.

The other elements may be the same as those described above with reference to FIG. 11; and, therefore, redundant descriptions thereof will be omitted.

Figure 14:
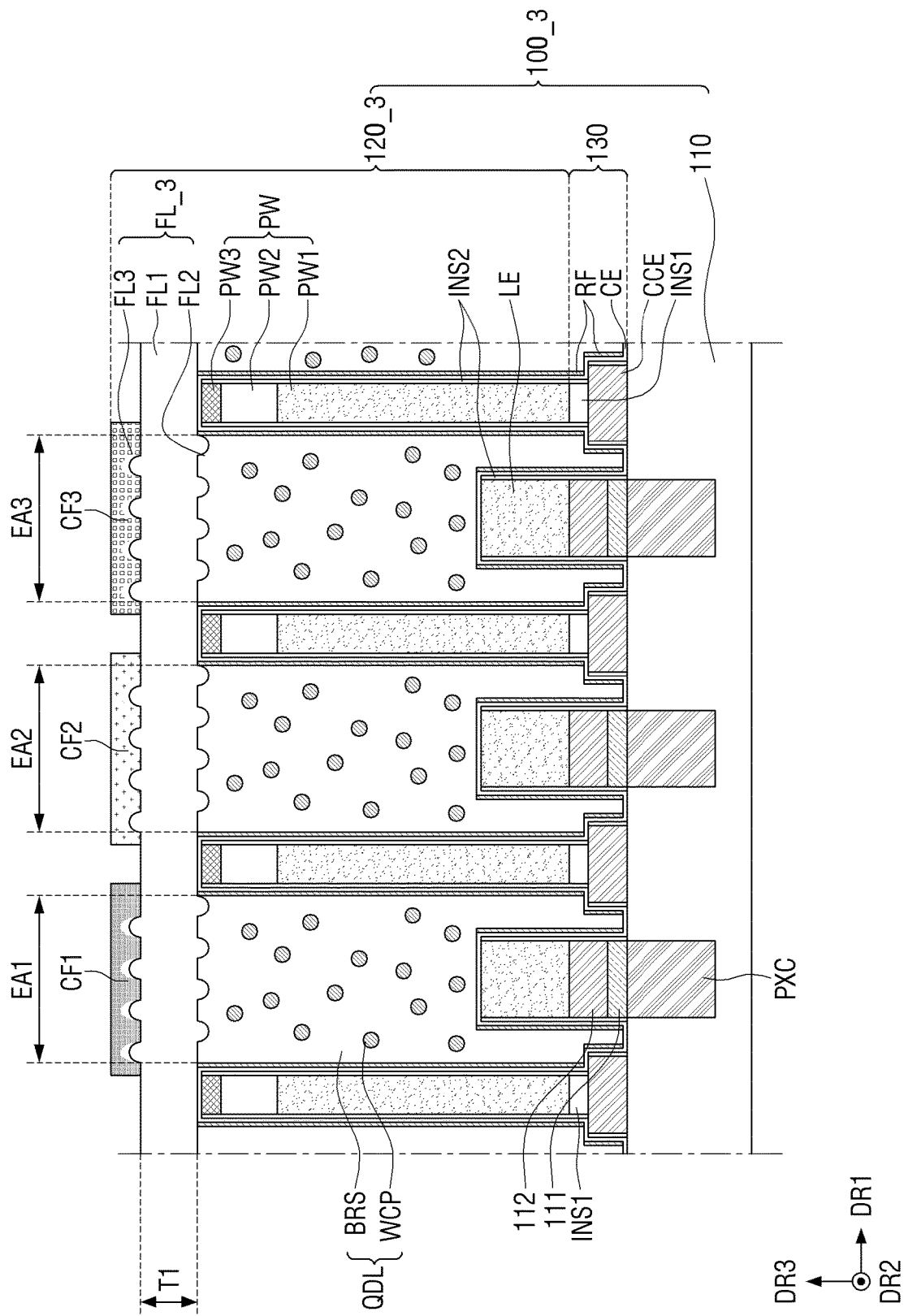
FIG. 14 is a cross-sectional view showing an example of a display panel according to another embodiment of the present disclosure.

FIG. 14 is a cross-sectional view showing an example of a display panel according to another embodiment of the present disclosure.

A display panel 100_3 according to the embodiment of FIG. 14 is different from the display panel 100_1 according to the embodiment of FIG. 11 in that first protruding patterns FL2 and second protruding patterns FL3 of an optical member FL_3 of a light-emitting element layer 120_3 do not overlap each other in the thickness direction.

The other elements may be the same as those described above with reference to FIG. 11; and, therefore, redundant descriptions thereof will be omitted.

Figure 15:
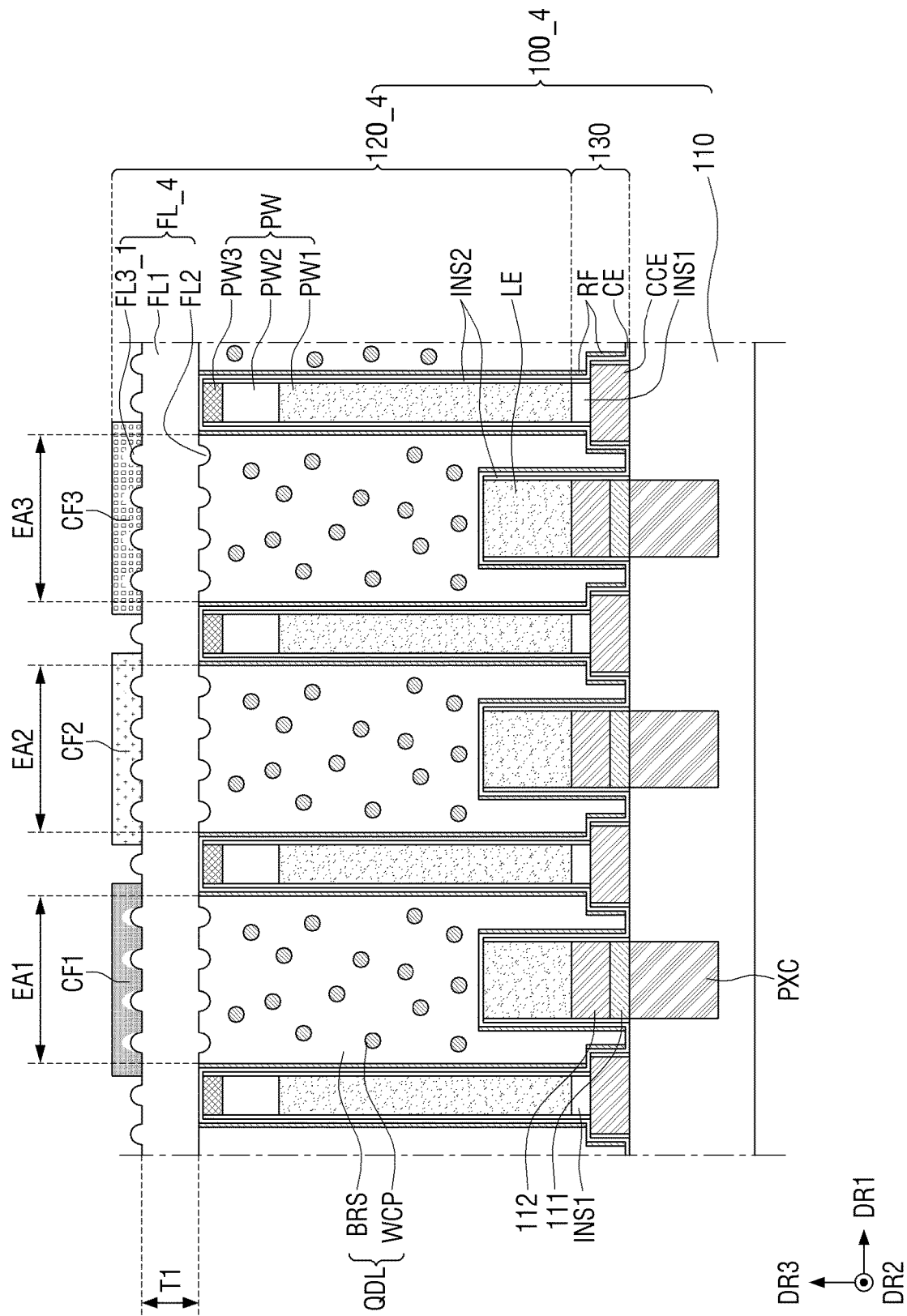
FIG. 15 is a cross-sectional view showing an example of a display panel according to another embodiment of the present disclosure.

FIG. 15 is a cross-sectional view showing an example of a display panel according to another embodiment of the present disclosure.

A display panel 100_4 according to the embodiment of FIG. 15 is different from the display panel 100_1 according to the embodiment of FIG. 11 in that second protruding patterns FL3_1 of an optical member FL_4 of a light-emitting element layer 120_4 are arranged differently.

More specifically, a plurality of second protruding patterns FL3_1 of the optical member FL_4 may be disposed, and some of the plurality of second protruding patterns FL3_1 may overlap with the partition wall PW in the thickness direction. According to an embodiment, the second protruding patterns FL3_1 may be formed via, but is not limited to, a photomask process or a rubbing process.

According to an embodiment, some of the plurality of second protruding patterns FL3_1 overlap with the partition wall PW in the thickness direction, such that luminous efficiency can be improved by the second protrusion patterns FL3_1 overlapping the partition wall PW by way of guiding lights traveling between adjacent emission areas EA1, EA2, and EA3 among the lights output from the wavelength conversion layer QDL.

Figure 16:
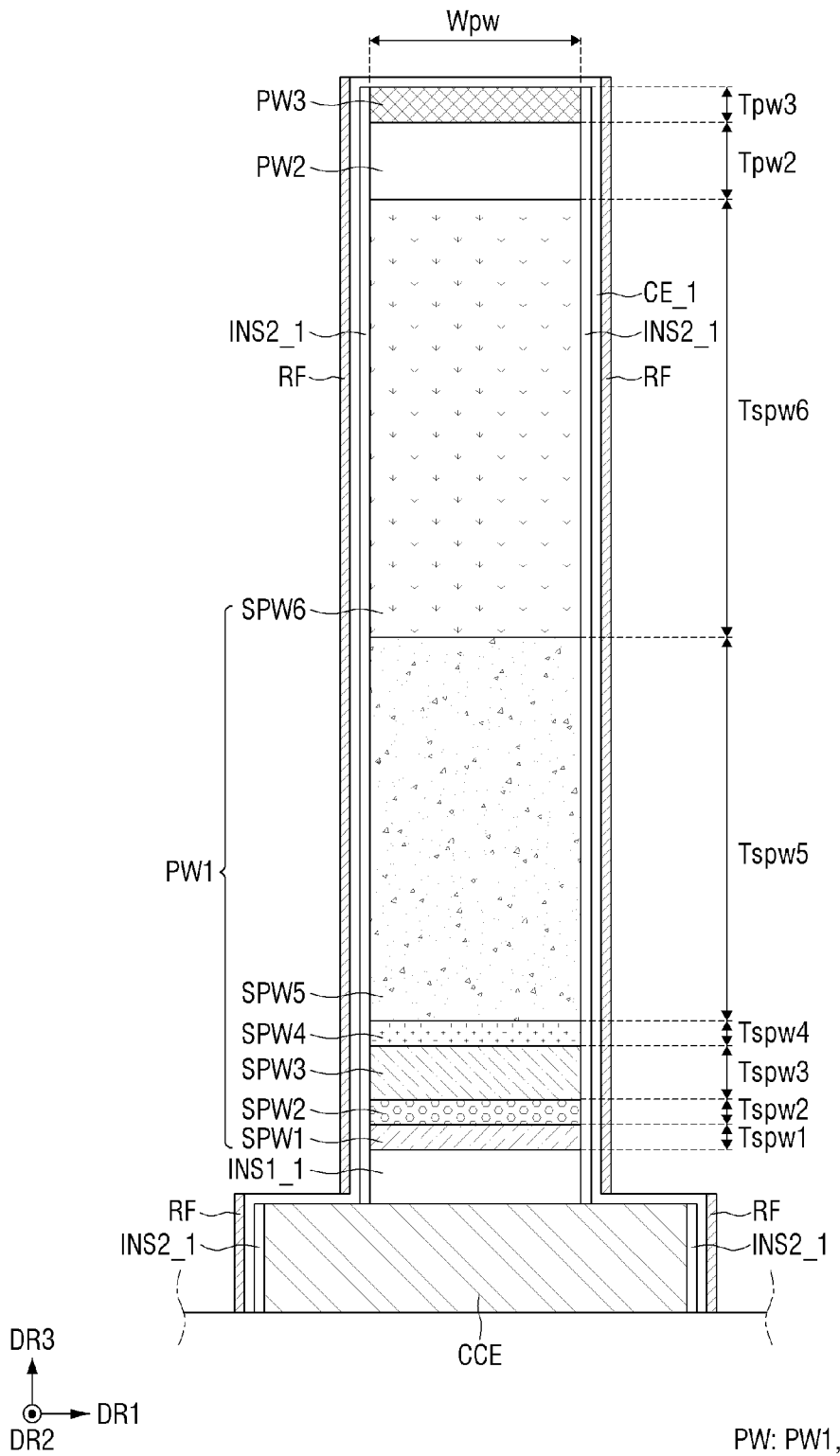
FIG. 16 is an enlarged cross-sectional view showing another example of the partition wall of FIG. 5.

FIG. 16 is an enlarged cross-sectional view showing another example of the partition wall of FIG. 5.

In the embodiment of FIG. 16, a first insulating film INS1_1 does not completely cover the upper surface of the common connection electrode CCE. The elements of FIG. 16 which are the same as those of FIG. 7 will not be described in further detail to avoid redundancy.

Referring to FIG. 16, the first insulating film INS1_1 may be disposed on the upper surface of the common connection electrode CCE. Accordingly, a common electrode CE_1 may be in contact with the upper surface of the common connection electrode CCE. In this case, the common electrode CE_1 may be connected to a common voltage supply in the non-display area NDA to receive the common voltage.

A second insulating film INS2_1 may be disposed on side surfaces of the first insulating film INS1_1, and a reflective film RF may be disposed on the common electrode CE_1 disposed on the side surfaces of the first insulating film INS1_1.

Figure 17:
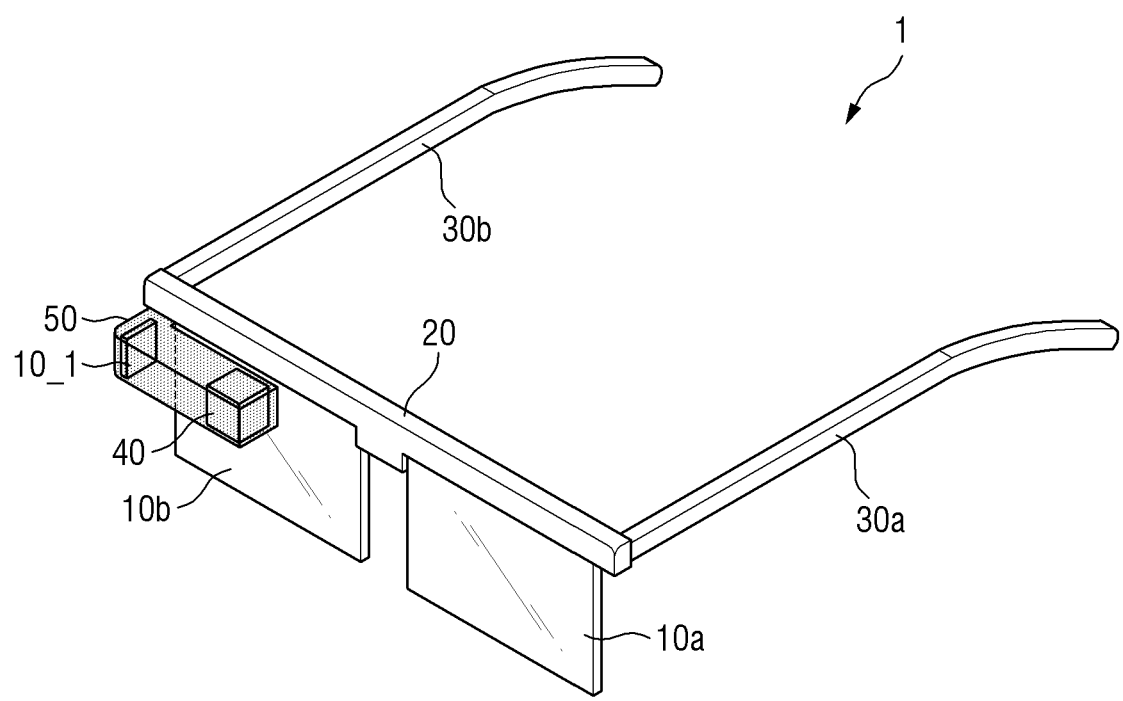
FIG. 17 is a view showing an example of a virtual reality device including a display device according to an embodiment of the present disclosure.

FIG. 17 is a view showing an example of a virtual reality device including a display device according to an exemplary embodiment.

FIG. 17 shows a virtual reality device 1 employing a display device 10_1 according to an embodiment of the present disclosure.

Referring to FIG. 17, the virtual reality device 1 according to an embodiment may be a device in the form of glasses. The virtual reality device 1 according to an embodiment of the present disclosure may include the display device 10_1, a left eye lens 10a, a right eye lens 10b, a support frame 20, eyeglass temples 30a and 30b, a reflective member 40, and a display case 50.

Although FIG. 17 shows the virtual reality device 1 including the eyeglass temples 30a and 30b, a head mounted display with a head strap, instead of the eyeglass temples 30a and 30b, may be employed as the virtual reality device 1 according to an embodiment of the present disclosure. That is, the virtual reality device 1 is not limited to that shown in FIG. 17 but may be applied in a variety of electronic devices in a variety of forms.

The display case 50 may include the display device 10_1 and the reflective member 40. An image displayed on the display device 10_1 may be reflected by the reflective member 40 and provided to a user's right eye through the right eye lens 10b. Accordingly, the user may watch a virtual reality image displayed on the display device 10_1 through the right eye.

Although the display case 50 is shown disposed at the right end of the support frame 20 in the example shown in FIG. 17, embodiments of the present disclosure are not limited thereto. For example, the display case 50 may be disposed at the left end of the support frame 20. In such a case, an image displayed on the display device 10_1 is reflected by the reflective member 40 and provided to a user's left eye through the left eye lens 10a. Accordingly, the user may watch a virtual reality image displayed on the display device 10_1 through the left eye. In another embodiment, display cases 50 may be disposed at both the left and right ends of the support frame 20, respectively. In such a case, a user can watch a virtual reality image displayed on the display device 10_1 through both the left and right eyes.

Figure 18:
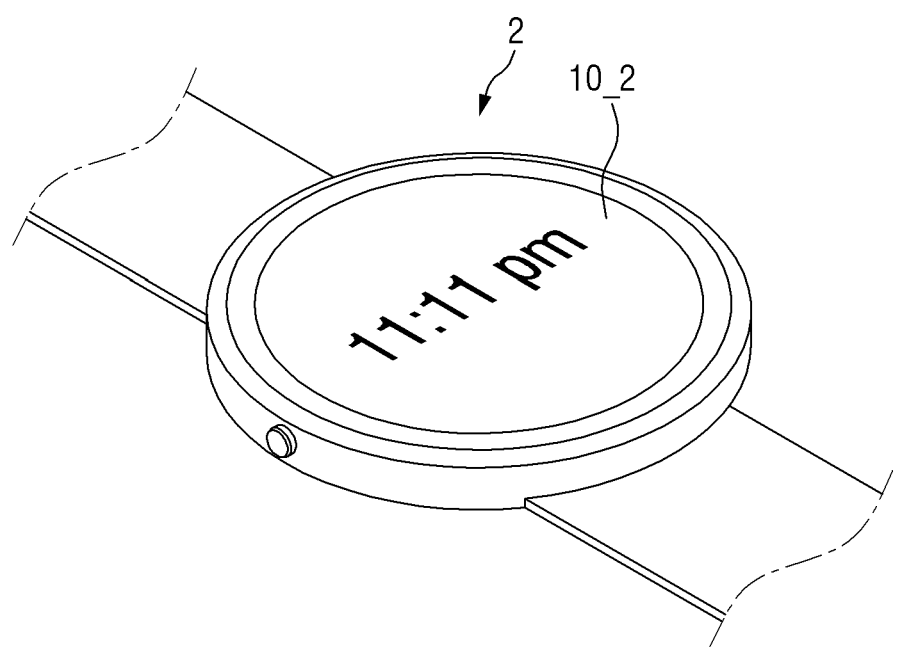
FIG. 18 is a view showing an example of a smart device including a display device according to an embodiment of the present disclosure.

FIG. 18 is a view showing an example of a smart device including a display device according to an embodiment of the present disclosure.

Referring to FIG. 18, a display device 10_2 according to an embodiment may be applied to a smart watch 2 that is one of smart devices.

Figure 19:
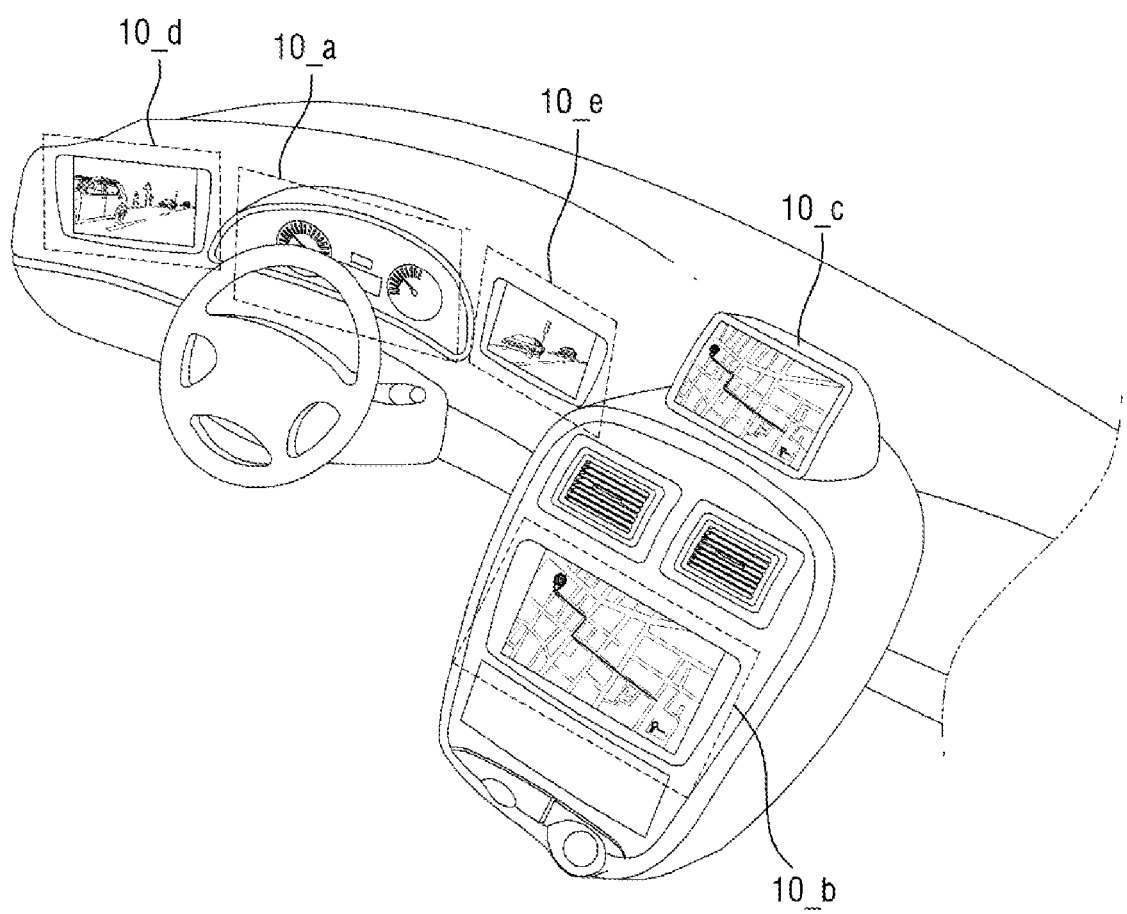
FIG. 19 is a view showing an example of an instrument cluster and a center fascia including display devices according to an embodiment of the present disclosure.

FIG. 19 is a view showing an example of an instrument cluster and a center fascia including display devices according to an embodiment of the present disclosure.

FIG. 19 shows a vehicle in which display devices 10_a, 10_b, 10_c, 10_d, and 10_e according to an embodiment are applied.

Referring to FIG. 19, the display devices 10_a, 10_b, and 10_c according to an embodiment of the present disclosure may be applied to the instrument cluster of a vehicle, may be applied to the center fascia of the vehicle, or may be applied to a center information display (CID) disposed on the dashboard of the vehicle. The display devices 10_d and 10_e according to an embodiment of the present disclosure may be applied to room mirror displays, which can replace side mirrors of the vehicle.

Figure 20:
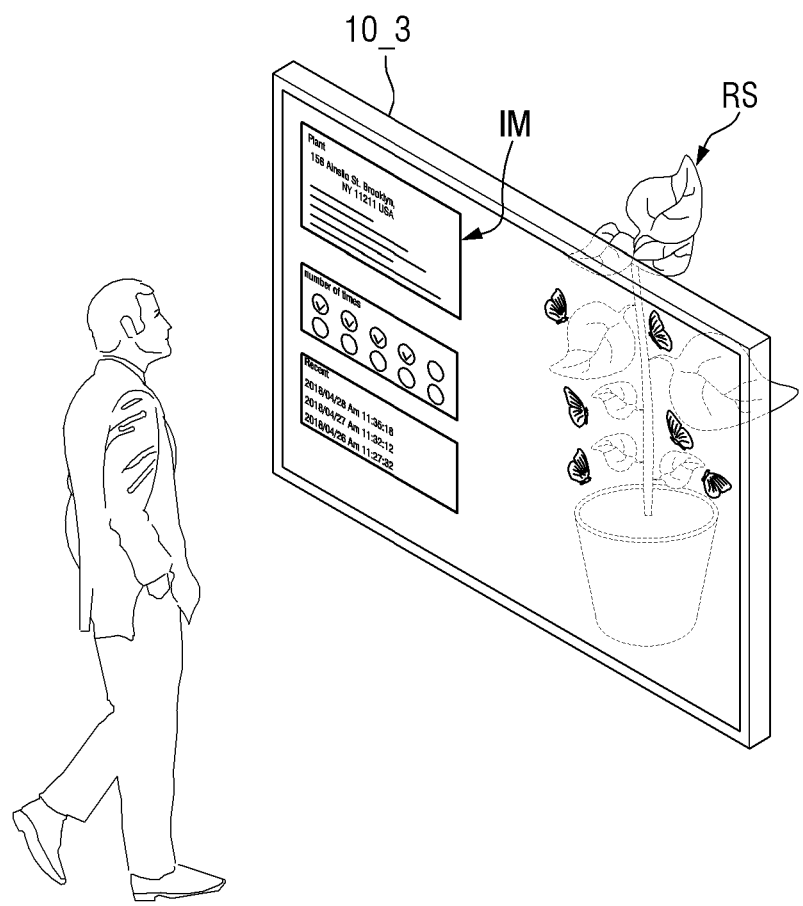
FIG. 20 is a view showing an example of a transparent display device including a display device according to an embodiment of the present disclosure.

FIG. 20 is a view showing an example of a transparent display device including a display device according to an embodiment of the present disclosure.

Referring to FIG. 20, a display device 10_3 according to an embodiment may be applied to a transparent display device. The transparent display device may transmit light while displaying images IM. Therefore, a user located on a front side of the transparent display device can not only view the images IM displayed on the display device 10_3 but also view an object RS or the background located on a rear side of the transparent display device. When the display device 10_3 is applied to the transparent display device, a substrate of the display device 10_3 may include a light-transmitting portion that can transmit light or may be made of a material that can transmit light.

Although some embodiments of the invention have been described herein for illustrative purposes, those skilled in the art will appreciate that various modifications, additions and substitutions are possible, without departing from the scope and spirit of the present invention as disclosed in the accompanying claims.

What is claimed is:

1. A display device comprising:
   a substrate;
   a partition wall on the substrate;
   a light-emitting element located in an emission area partitioned by the partition wall on the substrate and extended in a thickness direction of the substrate;
   a wavelength conversion layer over the light-emitting element in the emission area, and comprising a base resin and wavelength conversion particles dispersed in the base resin and configured to convert a wavelength of light emitted from the light-emitting element; and
   an optical member over the wavelength conversion layer and the partition wall and configured to adjust a path of light output from the wavelength conversion layer,
   wherein the optical member comprises an optical layer and a first protruding pattern protruding from the optical layer toward the wavelength conversion layer.

2. The display device of claim 1, wherein the first protruding pattern is connected directly to the optical layer, and the first protruding pattern is in direct contact with the base resin.

3. The display device of claim 2, further comprising a color filter on the optical layer in the emission area.

4. The display device of claim 3, wherein the optical member further comprises at least one second protruding pattern protruding from the optical layer toward the color filter.

5. The display device of claim 4, wherein the second protruding pattern is in direct contact with the color filter.

6. The display device of claim 4, wherein the at least one second protruding pattern comprises a plurality of second protruding patterns, and wherein some of the plurality of second protruding patterns overlap the partition wall.

7. The display device of claim 4, wherein a cross-sectional shape of the first protruding pattern comprises a lens shape that is convex downward, and wherein an initial angle of the lens shape is 30 degrees or more.

8. A display device comprising:
   a substrate;
   a partition wall on the substrate;
   a light-emitting element located in an emission area partitioned by the partition wall on the substrate and extended in a thickness direction of the substrate;
   a wavelength conversion layer over the light-emitting element in the emission area, and comprising a base resin and wavelength conversion particles dispersed in the base resin and configured to convert a wavelength of light emitted from the light- emitting element; and
   an optical member on the wavelength conversion layer and the partition wall and configured to adjust a path of light output from the wavelength conversion layer,
   wherein the optical member comprises an optical layer and a first protruding pattern protruding from the optical layer toward the wavelength conversion layer, and wherein the partition wall comprises a first partition wall comprising a part having a same material as the light-emitting element.

9. The display device of claim 8, wherein the light-emitting element comprises a first semiconductor layer; an active layer on the first semiconductor layer; and a second semiconductor layer on the active layer.

10. The display device of claim 9, wherein the first partition wall comprises a first subsidiary partition wall comprising a same material as the first semiconductor layer, a second subsidiary partition wall comprising a same material as the active layer, and a third subsidiary partition wall comprising a same material as the second semiconductor layer.

11. The display device of claim 10, wherein a thickness of the third subsidiary partition wall is equal to or greater than a thickness of the second semiconductor layer.

12. The display device of claim 10, wherein the first partition wall further comprises a fourth subsidiary partition wall on the third subsidiary partition wall and comprising an undoped semiconductor material.

13. The display device of claim 12, wherein a thickness of the fourth subsidiary partition wall is greater than a thickness of the second semiconductor layer.

14. The display device of claim 8, wherein the partition wall further comprises a second partition wall on the first partition wall and comprising an insulating material; and a third partition wall on the second partition wall and comprising a conductive material,
wherein a thickness of the second partition wall is greater than a thickness of the third partition wall.

15. A display device comprising:
a substrate;
a partition wall on the substrate;
a light-emitting element located in an emission area partitioned by the partition wall on the substrate and extended in a thickness direction of the substrate;
a wavelength conversion layer over the light-emitting element in the emission area, and comprising a base resin and wavelength conversion particles dispersed in the base resin and configured to convert a wavelength of light emitted from the light- emitting element;
an optical member over the wavelength conversion layer and the partition wall and configured to adjust a path of light output from the wavelength conversion layer; and
a color filter on the optical member in the emission area,
wherein a refractive index of the optical member is greater than a refractive index of the color filter and a refractive index of the base resin.

16. The display device of claim 15, wherein the optical member comprises an optical layer and a first protruding pattern protruding from the optical layer toward the wavelength conversion layer.

17. The display device of claim 16, wherein the first protruding pattern is connected directly to the optical layer, and the first protruding pattern is in direct contact with the base resin.

18. The display device of claim 17, wherein a refractive index of the first protruding pattern is greater than the refractive index of the base resin.

19. The display device of claim 18, wherein the optical member further comprises at least one second protruding pattern protruding from the optical layer toward the color filter, and wherein the second protruding pattern is in direct contact with the color filter.

20. The display device of claim 19, wherein a refractive index of the second protruding pattern is greater than the refractive index of the color filter.

21. The display device of claim 19, wherein the at least one second protruding pattern comprises a plurality of second protruding patterns, and wherein some of the plurality of second protruding patterns overlap the partition wall.

* * * * *